(12) United States Patent
Hirano et al.

(10) Patent No.: US 7,751,922 B2
(45) Date of Patent: Jul. 6, 2010

(54) SEMICONDUCTOR MANUFACTURING APPARATUS AND MANUFACTURING OF A SEMICONDUCTOR DEVICE

(75) Inventors: Makoto Hirano, Toyama (JP); Norichika Yamagishi, Toyama (JP); Akihiro Yoshida, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 438 days.

(21) Appl. No.: 11/662,631

(22) PCT Filed: Oct. 3, 2005

(86) PCT No.: PCT/JP2005/018283

§ 371 (c)(1), (2), (4) Date: Apr. 3, 2007

(87) PCT Pub. No.: WO2006/038584

PCT Pub. Date: Apr. 13, 2006

(65) Prior Publication Data
US 2008/0127467 A1 Jun. 5, 2008

(30) Foreign Application Priority Data
Oct. 6, 2004 (JP) ............................. 2004-293244

(51) Int. Cl.
*G06F 19/00* (2006.01)
*H01L 21/68* (2006.01)

(52) U.S. Cl. ...................... 700/112; 700/108; 700/110; 700/114; 700/121; 700/228; 438/14

(58) Field of Classification Search ................. 700/108, 700/110, 112, 114, 121, 228; 438/14
See application file for complete search history.

(56) References Cited

U.S. PATENT DOCUMENTS

| | | | | |
|---|---|---|---|---|
| 5,153,841 | A | * 10/1992 | Goff et al. ................... | 700/228 |
| 7,248,931 | B2 | * 7/2007 | Raaijmakers ................ | 700/57 |
| 2002/0099470 | A1 | * 7/2002 | Zinger et al. ................ | 700/228 |
| 2006/0100740 | A1 | * 5/2006 | Sakiya et al. ............... | 700/246 |

FOREIGN PATENT DOCUMENTS

JP 61280631 A * 12/1986

(Continued)

OTHER PUBLICATIONS

"Detection of faulty products using data mining", Karim et al, Queensland University of technology, Helsinky Finaland, 2008 IEEE.*

(Continued)

*Primary Examiner*—Michael D Masinick
(74) *Attorney, Agent, or Firm*—McGinn IP Law Group, PLLC

(57) ABSTRACT

A processing furnace for performing prescribed heat treatment on plural substrates, a boat for carrying the plural substrates that are laid one over another in the boat into and out of the processing furnace, a substrate detecting sensor for detecting the plural substrates laid one over another in the boat by changing a relative position of the substrate detecting sensor with respect to each of the plural substrates, and a control section for registering reference positions of the plural substrates and an allowable range of positional deviations from the reference positions of the plural substrates are provided. The control section receives pieces of position information of the plural substrates measured by the substrate detecting sensor, compares a maximum value of pieces of position information of substrates with an average thereof and compares a minimum value of pieces of position information of substrates with an average thereof if the pieces of position information of the plural substrates are out of the allowable range of positional deviations from the reference positions of the plural substrates, and judges that deviation has occurred in a boat stop position if differences determined by the respective comparisons are within the allowable range of deviations of the substrates.

9 Claims, 15 Drawing Sheets

FOREIGN PATENT DOCUMENTS

| | | | |
|---|---|---|---|
| JP | 3-181124 | | 8/1991 |
| JP | 3-181124 A | | 8/1991 |
| JP | 05-041442 | | 2/1993 |
| JP | 6-227626 | | 8/1994 |
| JP | 6-227626 A | | 8/1994 |
| JP | 06-298315 | | 10/1994 |
| JP | 07-142553 | | 6/1995 |
| JP | 7-147314 | | 6/1995 |
| JP | 7-147314 A | | 6/1995 |
| JP | 07142553 A | * | 6/1995 |
| JP | 08070029 A | * | 3/1996 |
| JP | 10-12562 | | 1/1998 |
| JP | 10326819 A | * | 12/1998 |
| JP | 11-297790 | | 10/1999 |

OTHER PUBLICATIONS

"Model-based Control of Rapid Thermal Processing for Semiconductor Wafers", Ebert et al, 2004 American Control Conference, Boston, Massachusetts, Jun. 30, 2004.*

Form PCT/IB/373.

Form PCT/ISA/237.

* cited by examiner

FIG.2(a)
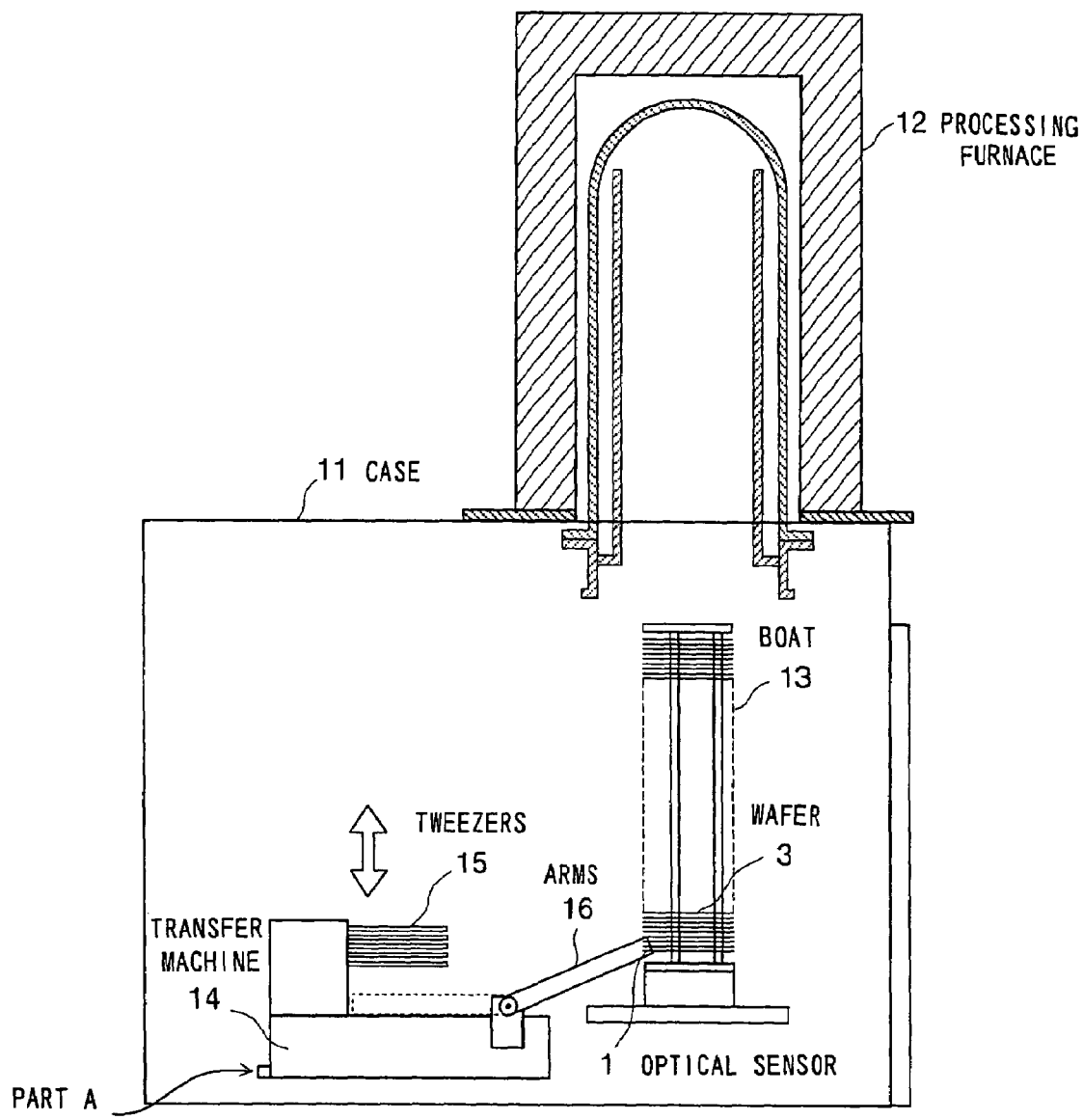
FIG.2(b) DETAILS OF PART A
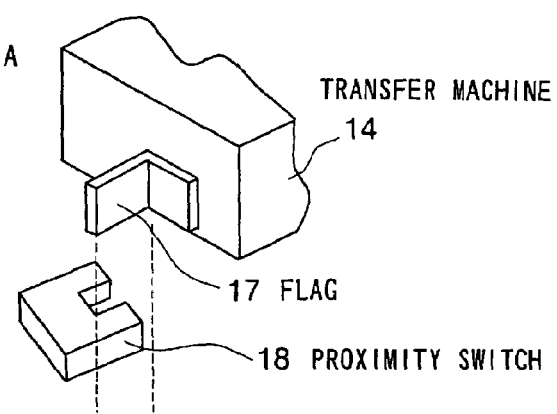

FIG.10(a)
FIG.10(b)
FIG.10(c)
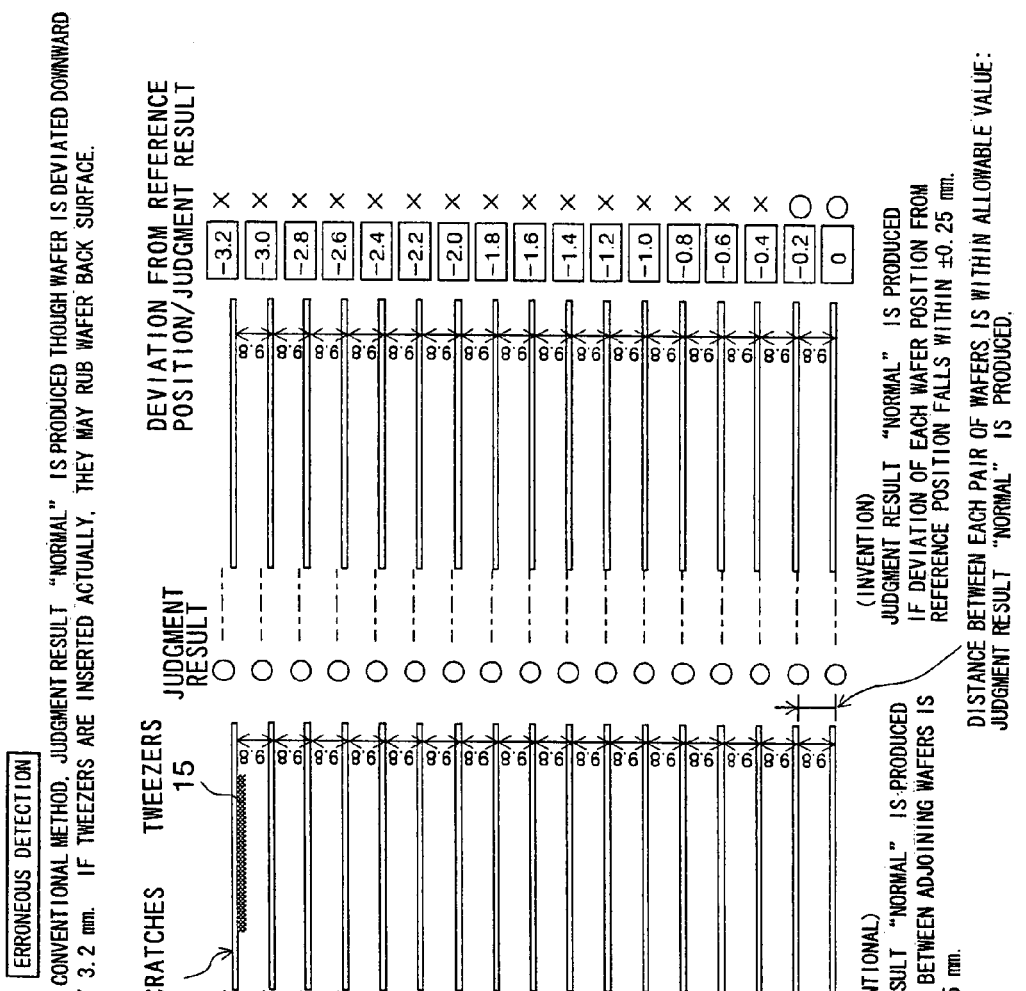
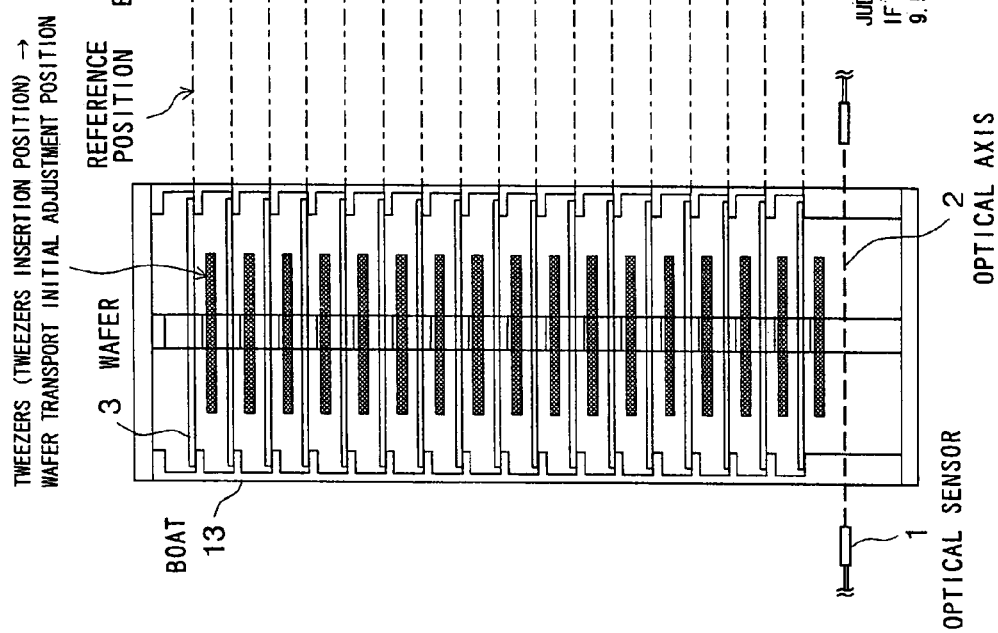

NO WAFERS ARE PLACED IN SOME REGIONS

SOME WAFERS DO NOT HAVE ADJACENT WAFER

WAFER 3
BOAT 13

ORDINARY

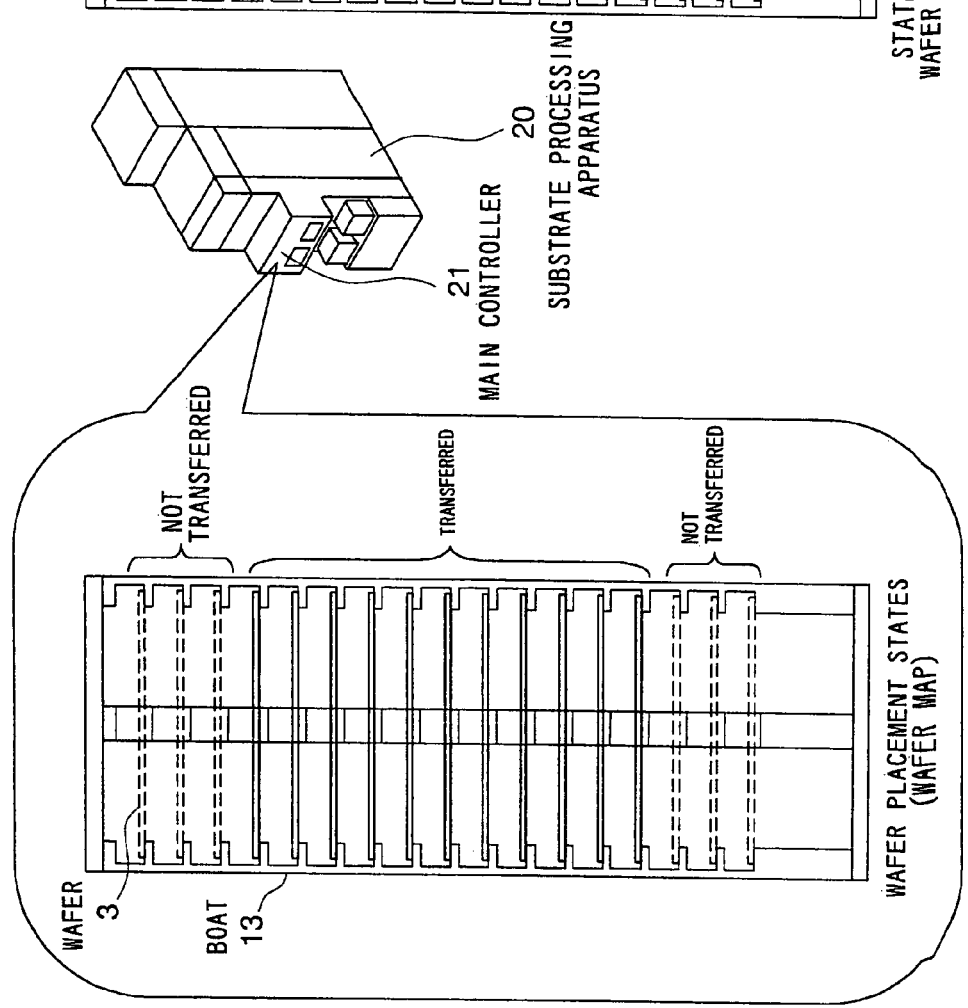

SEMICONDUCTOR MANUFACTURING APPARATUS AND MANUFACTURING OF A SEMICONDUCTOR DEVICE

TECHNICAL FIELD

The present invention relates to a semiconductor manufacturing apparatus having a function of detecting substrate positions during a manufacturing process as well as to a semiconductor device manufacturing method which performs processing using it.

BACKGROUND ART

Conventionally, to detect the positions of substrates such as semiconductor substrates (hereinafter referred to as "wafers") during a manufacturing process, semiconductor manufacturing apparatus are provided with a wafer state detecting mechanism. Such a wafer state detecting mechanism judges whether or not wafer states in a manufacturing process are normal by comparing, for example, intervals between adjoining wafers or the positions of wafers in other slots that are placed in a boat with preset position information. That is, in the conventional wafer state detecting method, intervals (hereinafter referred to as "wafer pitches") between adjoining wafers placed in a boat are compared with preset position information and a judgment result "normal states" is produced if positional deviations (interval deviations) are smaller than or equal to an allowable error limit $\Delta t$ for successful transport by a wafer transfer machine.

In the field of semiconductor manufacturing apparatus, many techniques for performing prescribed semiconductor manufacturing processing while detecting wafer positions have been reported. For example, a technique is disclosed in which wafer position data are acquired in advance for the three lowest stages of a boat, whether or not boat groove positions are within an allowable range is judged, placement positions are registered, and transport is performed (refer to Patent document 1, for example). Another technique is disclosed in which in detecting the positions of wafers in a boat, the origin position of the boat is employed as a detection start position (refer to Patent document 2, for example). A further technique is disclosed in which the inclination of a boat is detected by checking the position of a boat main body with a position sensor (refer to Patent document 3, for example).

Patent document 1: JP-A-7-142553
Patent document 2: JP-A-5-41442
Patent document 3: JP-A-6-298315

DISCLOSURE OF THE INVENTION

Problems to Be Solved by the Invention

However, since wafers are placed in a board in multiple stages, the above-mentioned allowable error limits $\Delta t$ are accumulated as the number of detected wafers increases. For example, in detecting wafer states of n wafers placed in a boat with a wafer pitch of 10 mm, a wafer state is judged normal if the range defined by the allowable error limit $\Delta t$ is ±0.5 mm and a wafer pitch is within a range of 9.5 to 10.5 mm. Therefore, a judgment result "normal" is produced if the interval between the first and second wafers is 9.8 mm. A judgment result "normal" is also produced if the interval between the second and third wafers is 9.8 mm. If all wafer intervals that have been detected in the same manner to the nth wafer are 9.8 mm, the nth wafer should be deviated from the reference position by $\{(n-1)\times 0.2\}$ mm. However, even in this case, all the wafer positions are judged normal because the intervals of the adjacent wafers are normal.

In the above example, although the position of the 11th wafer, for example, should be deviated from the reference position by 2 mm, the judgment method of the conventional wafer state detecting mechanism judges that all the wafer positions are normal. If a wafer transport operation is performed in this state by a wafer transfer machine, there may occur an event that tweezers scratch the back surface of a wafer to produce back scratches there or tweezers hit a wafer to damage a boat. Furthermore, a wafer may be rubbed by a boat groove. That is, in the conventional wafer state detecting mechanism, wafer pitches are checked to confirm that no interference will occur even when tweezers of the wafer transfer machine are inserted between wafers placed in a boat and no measure is taken against accumulated errors of wafers. In addition, in the conventional wafer position detecting method, since a relative comparison is made of adjoining wafers, correct position detection cannot be performed unless wafers are placed in all the slots (i.e., a boat has no empty slots).

Furthermore, in the technique of Patent document 3, the inclination of a boat itself is detected and placement states of wafers in the boat are not detected by detecting the positions of the wafers mounted on the boat. That is, it is difficult for this technique to perform measurement on a quartz boat because quartz is a light-transmissive material. In addition, to detect wafer positions or placement states, it is necessary to provide two kinds of sensors, that is, a wafer detecting sensor for detecting wafer states and a boat detecting sensor for detecting a boat state. This results in increase of the cost of a semiconductor manufacturing apparatus.

The present invention has been made in view of the above problems, and an object of the invention is therefore to provide a semiconductor manufacturing apparatus having a wafer state detecting mechanism capable of correctly detecting whether or not wafer positional deviations are within an allowable range irrespective of whether a boat has empty slots as well as a semiconductor device manufacturing method which performs processing using it.

Means for Solving the Problems

To solve the above problems, a semiconductor manufacturing apparatus according to the invention is characterized by comprising a processing furnace for performing prescribed heat treatment on plural substrates; a boat for carrying the plural substrates that are laid one over another in the boat into and out of the processing furnace; a substrate detecting sensor for detecting the plural substrates laid one over another in the boat by changing a relative position of the substrate detecting sensor with respect to each of the plural substrates; and a control section for registering reference positions of the plural substrates and an allowable range of positional deviations from the reference positions of the plural substrates. The semiconductor manufacturing apparatus is further characterized in that the control section receives pieces of position information of the plural substrates measured by the substrate detecting sensor, compares a maximum value of pieces of position information of substrates with an average thereof and compares a minimum value of pieces of position information of substrates with an average thereof if a piece or pieces of position information of substrates are out of the allowable range of positional deviations from the reference positions of the plural substrates, and judges that deviation has occurred in a boat stop position if differences determined by the respective comparisons are within the allowable range of deviations of the substrates.

The control section is characterized in outputting a failure signal indicating occurrence of deviation in the boat stop position if the differences determined by the respective comparisons are within the allowable range of deviations of the substrates.

The control section is characterized in comparing a maximum value of pieces of position information of a preset, prescribed proportion, in number, of all of the plural substrates with an average thereof and comparing a minimum value of pieces of position information of a preset, prescribed proportion, in number, of all of the plural substrates with an average thereof.

The control section is characterized in comparing a maximum value of pieces of position information of a preset, prescribed number of substrates with an average thereof and comparing a minimum value of pieces of position information of a preset, prescribed number of substrates with an average thereof.

The control section is characterized in comparing a maximum value of the pieces of position information of all of the plural substrates with an average thereof and comparing a minimum value of the pieces of position information of all of the plural substrates with an average thereof.

Another semiconductor manufacturing apparatus according to the invention is characterized by comprising a processing furnace for performing prescribed heat treatment on plural substrates; a boat for carrying the plural substrates that are laid one over another in the boat into and out of the processing furnace; a substrate detecting sensor for detecting the plural substrates laid one over another in the boat by changing a relative position of the substrate detecting sensor with respect to each of the plural substrates; and a control section for registering reference positions of the plural substrates and an allowable range of positional deviations from the reference positions of the plural substrates. The semiconductor manufacturing apparatus is further characterized in that the control section receives pieces of position information of the plural substrates measured by the substrate detecting sensor, checks whether substrate positions vary gradually if a piece or pieces of position information of substrates are out of the positional deviation allowable range, and judges that boat deformation has occurred if a gradual variation of the substrate positions is detected.

A semiconductor device manufacturing method according to the invention for performing processing using the above semiconductor manufacturing apparatus is characterized by comprising the steps of the control section's receiving pieces of position information of the plural substrates measured by the substrate detecting sensor, and replacing the plural substrates laid one over another in the boat with plural substrates to be processed next time if the pieces of position information of the plural substrates are not out of an allowable range of positional deviations from reference positions of the plural substrates; and transporting, into the processing furnace, the boat in which the plural substrates to be processed next time are laid one over another, and performing prescribed heat treatment in the processing furnace on the plural substrates to be processed next time.

The control section is characterized in outputting a failure signal indicating occurrence of boat deformation if detecting a gradual variation of substrate positions by checking whether the substrate positions vary gradually.

Another semiconductor manufacturing apparatus according to the invention is characterized by comprising a processing furnace for performing prescribed heat treatment on plural substrates; a boat for carrying the plural substrates that are laid one over another in the boat into and out of the processing furnace; a substrate detecting sensor for detecting the plural substrates laid one over another in the boat by changing a relative position of the substrate detecting sensor with respect to each of the plural substrates; and a control section for measuring positions of the plural substrates with the substrate detecting sensor after or during transport of the boat out of the processing furnace when the plural substrates have been subjected to the heat treatment in the processing furnace, comparing measurement values with plural registered reference positions, and judging that an abnormality has occurred in the substrate positions if results of comparison are out of an allowable range of deviations of the plural substrates.

The control section is characterized in outputting a failure signal if judging that an abnormality has occurred in the substrate positions.

Another semiconductor device manufacturing method according to the invention for performing processing using the above semiconductor manufacturing apparatus is characterized by comprising the steps of the control section's measuring positions of the plural substrates with the substrate detecting sensor, comparing measurement values with plural registered reference positions, and replacing the plural substrates laid one over another in the boat with plural substrates to be processed next time if results of comparison are not out of an allowable range of deviations of the plural substrates; and transporting, into the processing furnace, the boat in which the plural substrates to be processed next time are laid one over another, and performing prescribed heat treatment in the processing furnace on the plural substrates to be processed next time.

Advantages Of The Invention

As described above in detail, according to the invention, since deviations of respective substrates (wafers) from their reference positions are detected, deviations of wafer detection positions are not accumulated even at top stages. Therefore, even if a tweezers inserting operation is performed during processing of wafers, no back scratches are formed on the wafers and tweezers do not hit the wafers. As a result, the yield of wafer products is increased further. A semiconductor manufacturing apparatus and a semiconductor device manufacturing method which are high in the quality management level can thus be provided.

BRIEF DESCRIPTION OF THE DRAWINGS

FIG. 2 is a sectional view of a substrate processing apparatus and shows a processing furnace and its peripheral structures and machines of the semiconductor manufacturing apparatus according to the invention.

FIG. 10 is a conceptual diagram which compares wafer detection/judgment methods of a conventional wafer state detecting mechanism and the wafer state detecting mechanism according to the invention, in which FIG. 10(a) shows a wafer state detecting mechanism, FIG. 10(b) shows conventional detected states, and FIG. 10(c) shows detected states of the invention.

FIG. 12 is a conceptual diagram showing how a main controller controls wafer placement using a wafer map in the wafer state detecting mechanism according to the invention.

DESCRIPTION OF SYMBOLS

Figure 1:
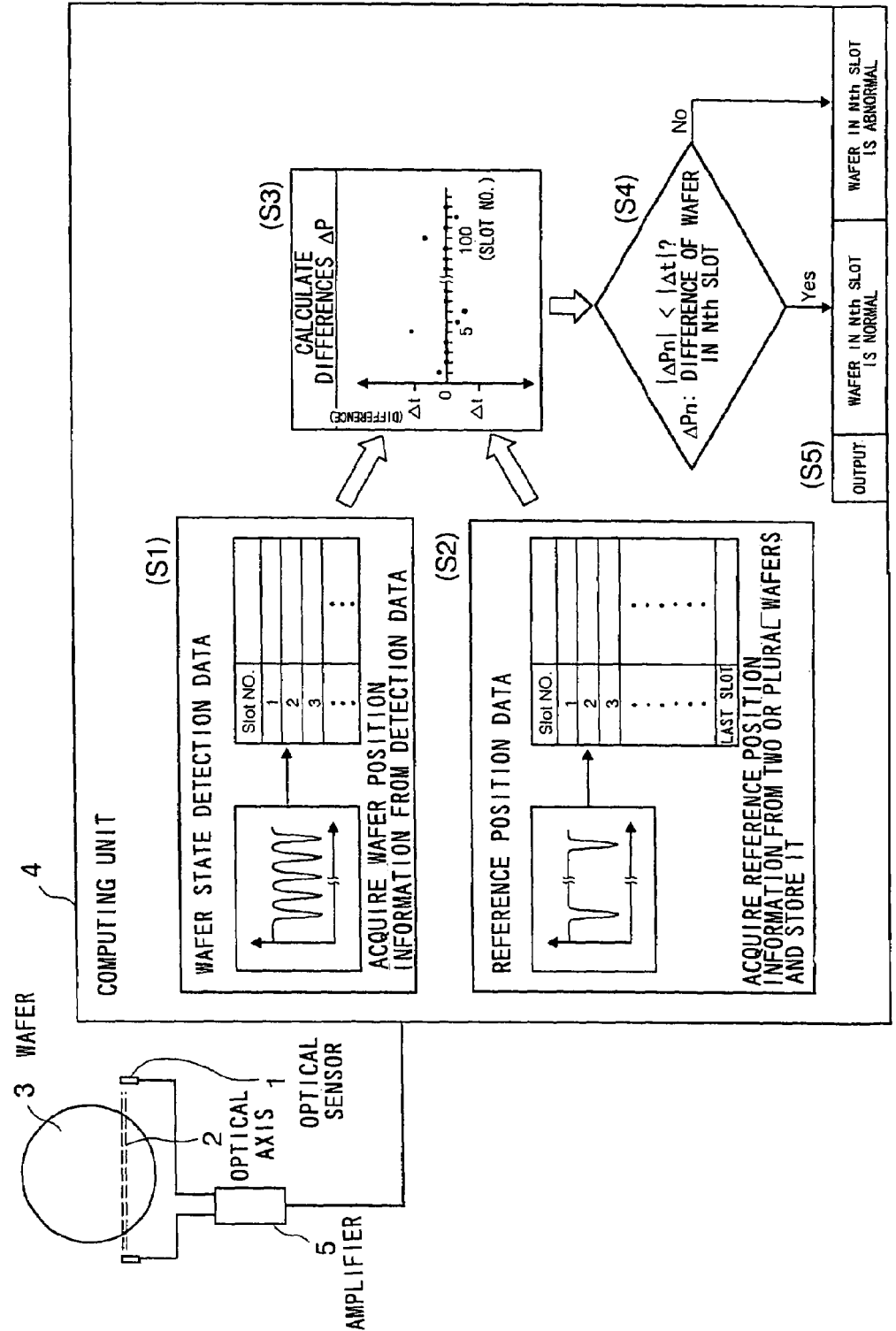
FIG. 1 is a conceptual diagram showing the configuration of a wafer state detecting mechanism of a semiconductor manufacturing apparatus according to the invention.

1: Optical sensor (substrate detecting sensor)
2: Optical axis
3: Wafer
4: Computing unit (control section)
5: Amplifier
11: Case
12: Processing furnace
13: Boat
14: Transfer machine
14a: Transfer machine main body
15: Tweezers
16: Arm
17: Flag
18: Proximity switch
19a: Pole
19b: Support groove

BEST MODE FOR CARRYING OUT THE INVENTION

Embodiments of the present invention will be hereinafter described in detail with reference to the drawings. In the following description, to facilitate understanding, the invention will be described by comparing it with conventional techniques when necessary.

FIG. 1 is a conceptual diagram showing the configuration of a wafer state detecting mechanism of a semiconductor manufacturing apparatus according to the invention. An optical sensor 1 which is provided in the wafer state detecting mechanism emits and receives light that travels along the optical axis 2 by means of a light-emitting element and a photodetecting element. The optical sensor 1 detects a placement state of a wafer 3 (e.g., presence/absence of a wafer, a wafer position, or a deviation from a reference position) by detecting whether the wafer 3 intersects the optical axis 2. Information of the placement state of the wafer 3 detected by the optical sensor 1 is sent to a computing unit 4, which then calculates a position of the wafer 3. The optical sensor 1 can be elevated and lowered along the vertical axis of a boat (not shown).

FIG. 2 is a sectional view of a substrate processing apparatus and shows a processing furnace and its peripheral structures and machines of the semiconductor manufacturing apparatus according to the invention. As shown in FIG. 2(a), a processing furnace 12 is mounted on a case 11, which accommodates, inside, a boat 13 in which wafers 3 are placed, a transfer machine 14, pairs of tweezers 15, arms 16 having the optical sensor 1 at the tips, and other things. As shown in FIG. 2(b) which is a detailed view of part A, a flag 17 is attached to the transfer machine 14 and a proximity switch 18 is fixed to a case-11-side member (not shown) at such a position as to correspond to the flag 17.

That is, in the wafer state detecting mechanism of the semiconductor manufacturing apparatus according to the invention, to send a start signal of acquisition of position data of the wafers 3, the flag 17 is attached to the transfer machine 14 and the proximity switch 18 is fixed so as to be located on a line that is parallel with the vertical axis of movement of the transfer machine 14. The proximity switch 18 is turned on when the flag 17 passes the proximity switch 18 as the transfer machine 14 which is equipped with the arms 16 having the optical sensor 1 is elevated or lowered along the vertical axis (not shown), whereby a start signal for acquisition of position data can be sent. The start signal is used as a signal indicating the origin position for calculation of reference position data.

Figure 3:
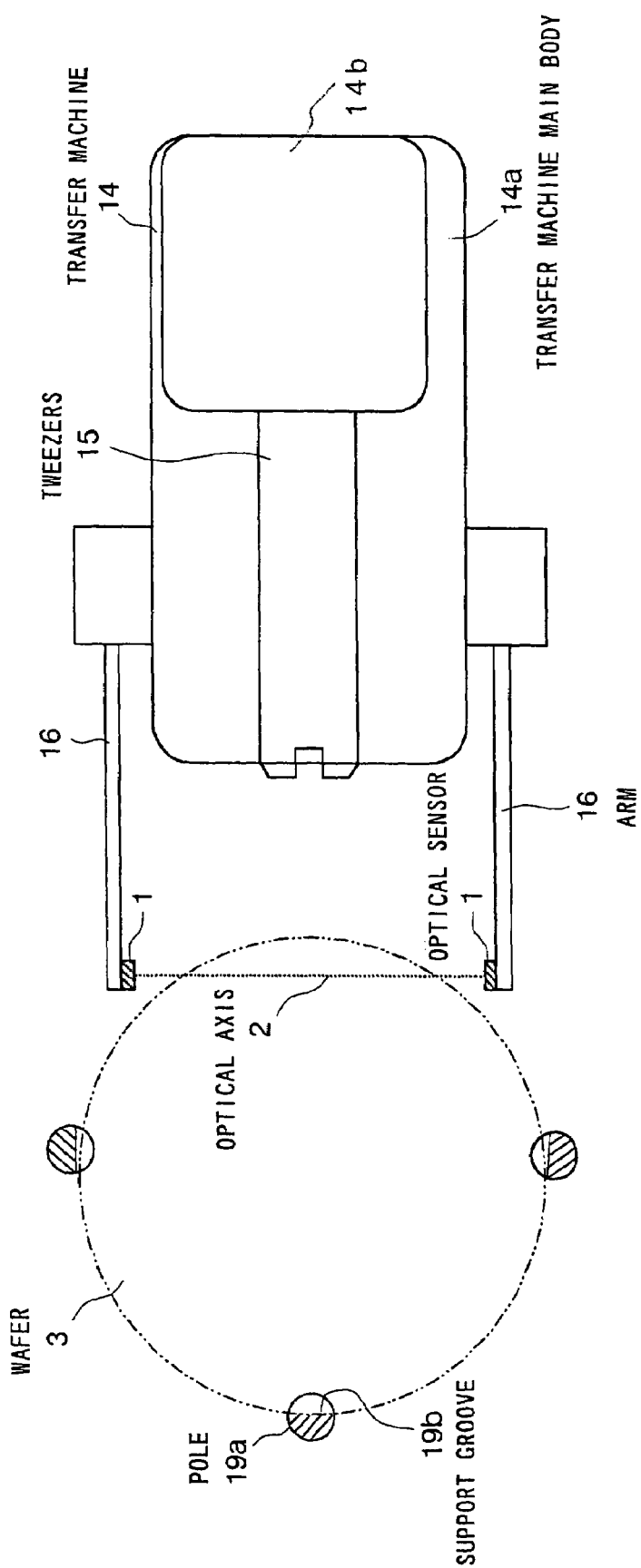
FIG. 3 is a plan view, as viewed from above, of a transfer machine shown in FIG. 2 and wafers that are placed in a boat.

FIG. 3 is a plan view, as viewed from above, of the transfer machine 14 shown in FIG. 2 and the wafers 3 that are placed in the boat. As shown in FIG. 3, three poles 19a stand along the vertical direction (i.e., along the direction perpendicular to the paper surface) and the wafers 3 are supported parallel with each other by support grooves 19b which are formed in the poles 19a. The transfer machine 14 is equipped with a transfer machine main body 14a which is moved in the vertical direction as well as rotated and a tweezers attachment unit 14b to which pairs of tweezers 15 are attached. The pairs of tweezers 15 are reciprocated over the transfer machine main body 14a. The two arms 16, which extend parallel with each other from the transfer machine main body 14a, are equipped with the optical sensor 1 in such a manner that the light-emitting element is provided at the tip of one arm 16 and the photodetector 1 is provided at the tip of the other arm 16. With this structure, the wafers 3 are detected as the transfer machine 14 is moved in the vertical direction parallel with the poles 19a, because the wafers 3 intersect the optical axis 2 of the optical sensor 1.

In the substrate processing apparatus of FIG. 2, a movement distance of the transfer machine 14 along the vertical movement axis can be obtained in the form of a pulse count of an encoder that is provided on an elevation/lowering rotary shaft (not shown). Being an integer of 00000 to 99999, for example, the pulse count is increased or decreased as the transfer machine is elevated or lowered and the rotary shaft is rotated. For example, a movement distance along the vertical axis is 0.004 mm/pulse; that is, a movement distance per pulse is very short, and the stop position accuracy is about 10 pulses (i.e., 0.04 mm). As such, movement is managed with very high accuracy.

In the wafer state detecting mechanism which is attached to the transfer machine 14, a movement distance to each boat slot (i.e., each set of grooves 19b of the poles 19a) with respect to an origin position which is indicated by a start signal that is produced by the data acquisition start switch consisting of the flag 17 and the proximity switch 18 is of very high accuracy so as not to adversely affect the accuracy of detection of an abnormality in wafer positions. For example, if the allowable range of a deviation of each wafer 3 from a reference position is ±0.25 mm, detection accuracy that is at least on the order of $10^{-3}$ mm is necessary for measuring a movement distance on the order of $10^{-2}$ mm with high accuracy. The detection accuracy of the wafer state detecting mechanism according to the invention well satisfies this condition.

The specification of manufacture of the boat 13 used in the substrate processing apparatus of FIG. 2 is such that the error should be 0.3 mm or less for a length of 1,000 mm and the pitch error of the boat slots should be 0.05 mm or less. With the above configuration of the wafer state detecting mechanism, it can be said that initial detection data to be used for determining reference positions are highly accurate absolute position data with which wafer position detection data are to be compared.

Next, with reference to FIG. 1, a description will be made of a process for acquiring reference position data with which wafer position detection data are to be compared as well as the wafer position detection data. Position data of the wafers 3 acquired by the optical sensor 1 are amplified by an amplifier 5 and taken in by the computing unit 4. Since an origin position is determined by turning-on of the start signal switch (proximity switch 18), wafer positions are determined with the origin position as a reference. The thus-determined positions of the wafers 3 are values of distances from the origin position. As described above, a distance is determined in such a manner that a rotation amount of a motor for elevating and lowering the transfer machine 14 is detected by the encoder (not shown) and an elevation distance (position) of the transfer machine 14 from the origin position is calculated on the basis of the detection amount (the number of pulses). That is, if a movement distance (mm) per one pulse that is output from the encoder is determined in advance, a movement distance can be obtained by counting the number of pulses that are produced by the encoder as the transfer machine 14 is moved from the origin position to a position of detection of a wafer 3 (where the transfer machine is stopped).

In other words, the computing unit 4 acquires wafer position (wafer detection) data from wafer state detection data obtained by the optical sensor 1 and record the data on a slot number basis (step S1). Then, the computing unit 4 records data on a slot number basis in such a manner that they are correlated with the numbers of pulses from an origin position that was detected by the start signal switch (proximity switch 18) (step S2). Reference position data are acquired and stored by using plural (two or more) wafers.

Differences ΔP between the wafer state detection data (i.e., wafer detection position data) and the reference position data which have been recorded (stored) on a slot number basis are determined on a slot number basis and are plotted as nth-slot differences ΔPn (step S3). Reference positions of plural substrates and an allowable error limit of substrate deviations from the reference positions of plural substrates are registered in a controller in advance. The term "reference positions of plural substrates" means values of distances from the origin position to the respective slots. They can be acquired under any of the following conditions (1)-(5), for example, and are registered in the controller in advance.

To detect positional deviations of plural substrates, a deviation of the boat origin position, and boat deformation after the substrates which are laid one over another in the boat have been subjected to heat treatment in the processing furnace and transported out of the processing furnace, height-direction positions of the plural substrates laid in the boat are measured and differences ΔPn between resulting measurement values and the reference positions that are registered in the controller in advance are determined. Positional deviations of the substrates can be detected reliably even if accumulated errors or the like occur.

The term "positional deviation of a substrate" includes all of a positional deviation of the whole of at least one substrate as a subject of measurement, a positional deviation of part of a substrate, and deformation of part of a substrate (e.g., sagging of a central portion of a substrate due to thermal deformation).

(1) The highest and lowest wafers (two wafers) are detected and position information of wafers located between them is acquired by calculation. The following conditions will be described in comparison with condition (1).

(2) One of the highest and lowest wafers is detected and position information of the other wafers is calculated on the basis of data of the one wafer.

In manufacturing a boat, errors within allowances in a drawing for manufacture necessarily exist. Therefore, with detection of only one slot, calculation results should be such as to be obtained with an assumption that design boat pitches are arranged continuously without errors. Acquiring theoretical position data by placing plural wafers in the highest and lowest slots (condition (1)) or intermediate slots provides higher reliability.

(3) Wafers are placed at respective, arbitrarily set stages and position information of all wafers is calculated on the basis of resulting detection results (three or more wafers may be used).

Data acquisition using arbitrary slots is possible. However, placing plural wafers at arbitrary slots that are adjacent to each other or relatively close to each other is meaningless. It is preferable to place wafers in slots that are distant from each other and equally spaced from each other. Where a wafer interval is very large, another wafer may be inserted between the wafers to further increase the accuracy of theoretical position data. However, a comparison between the resolution (i.e., an actually detectable deviation) 0.5 mm of the wafer detecting mechanism and the boat manufacture allowance ±0.1 mm shows that the method of condition (1) enables acquisition of sufficiently accurate theoretical position data, that is, it is not necessary to place plural wafers.

(4) Wafers are placed at all the stages, the wafers at all the stages are detected, and no calculation is performed.

In this case, wafers as high in accuracy as product wafers are necessary in the number of all slots.

(5) No wafers are used. All pieces of wafer position information are acquired only through calculation by using home position information of the boat drive shaft (elevation/lowering shaft) and boat design dimensions.

It is judged whether or not a relationship $|\Delta Pn|<|\Delta t|$ is satisfied where ΔPn is the difference between the reference position data and detection position data of the nth slot and Δt is the allowable error limit (step S4). If $|\Delta Pn|<|\Delta t|$, it is judged that the wafer in the nth slot is normal. If the relationship $|\Delta Pn|<|\Delta t|$ is not satisfied, it is judged that the wafer in the nth slot is abnormal. Individual judgment results are output (step S5).

Next, specific examples in which the number of boat slots is 100 will be described with reference to graphs of FIGS. 4, 5, 6, ad 7 each of which shows a relationship between slot numbers and nth-slot differences ΔPn between reference position data and detection position data in the nth slot. In the graph of each figure, the horizontal axis represents the boat slot number and the vertical axis represents the deviation of the detected wafer position from the reference position. As for deviations of detected wafer positions, signs "+" and "−" indicate an upward deviation and a downward deviation, respectively. The deviation of reference positions should be ±0 mm and the normal range of deviations of detected wafer positions (i.e., allowable error limit) is assumed to be ±0.5 mm.

Figure 4:
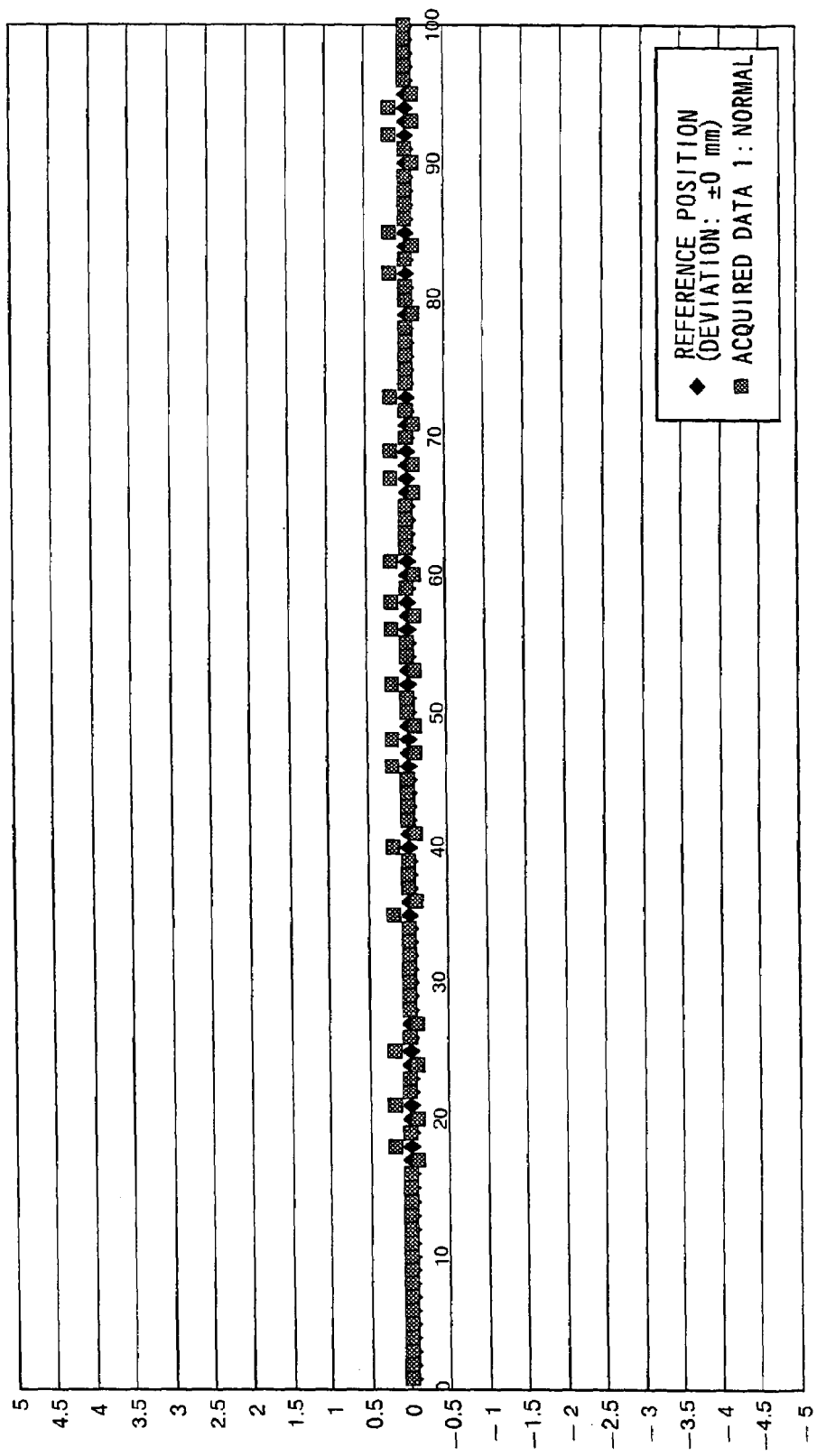
FIG. 4 is a graph of a case that acquired data of detected wafer positions of all slots are normal in the wafer state detecting mechanism according to the invention.

FIG. 4 is a graph of a case that acquired data of detected wafer positions of all the slots are normal in the wafer state detecting mechanism according to the invention. That is, as shown in FIG. 4, the differences ΔPn between reference position data and detection position data of all the slots are smaller than the allowable error limit Δt (±0.5 mm). The wafer states are thus judged normal.

Figure 5:
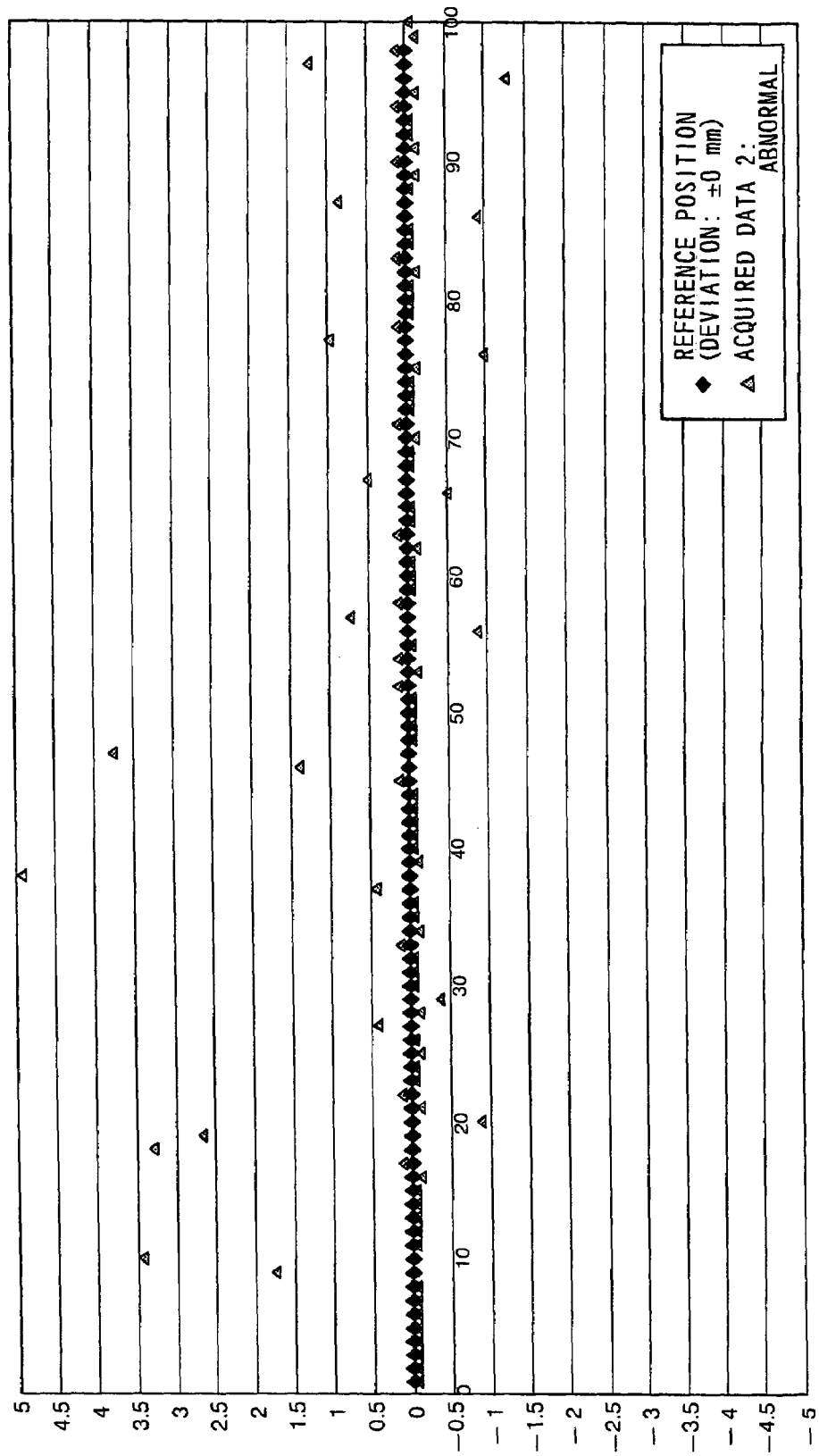
FIG. 5 is a graph of a case that acquired data of detected wafer positions are abnormal in the wafer state detecting mechanism according to the invention.

FIG. 5 is a graph of a case that acquired data of detected wafer positions are abnormal in the wafer state detecting mechanism according to the invention. That is, as shown in FIG. 5, the differences ΔPn between reference position data and detection position data of part of the slots are larger than the allowable error limit Δt (±0.5 mm). The wafer states are thus judged abnormal.

Figure 6:
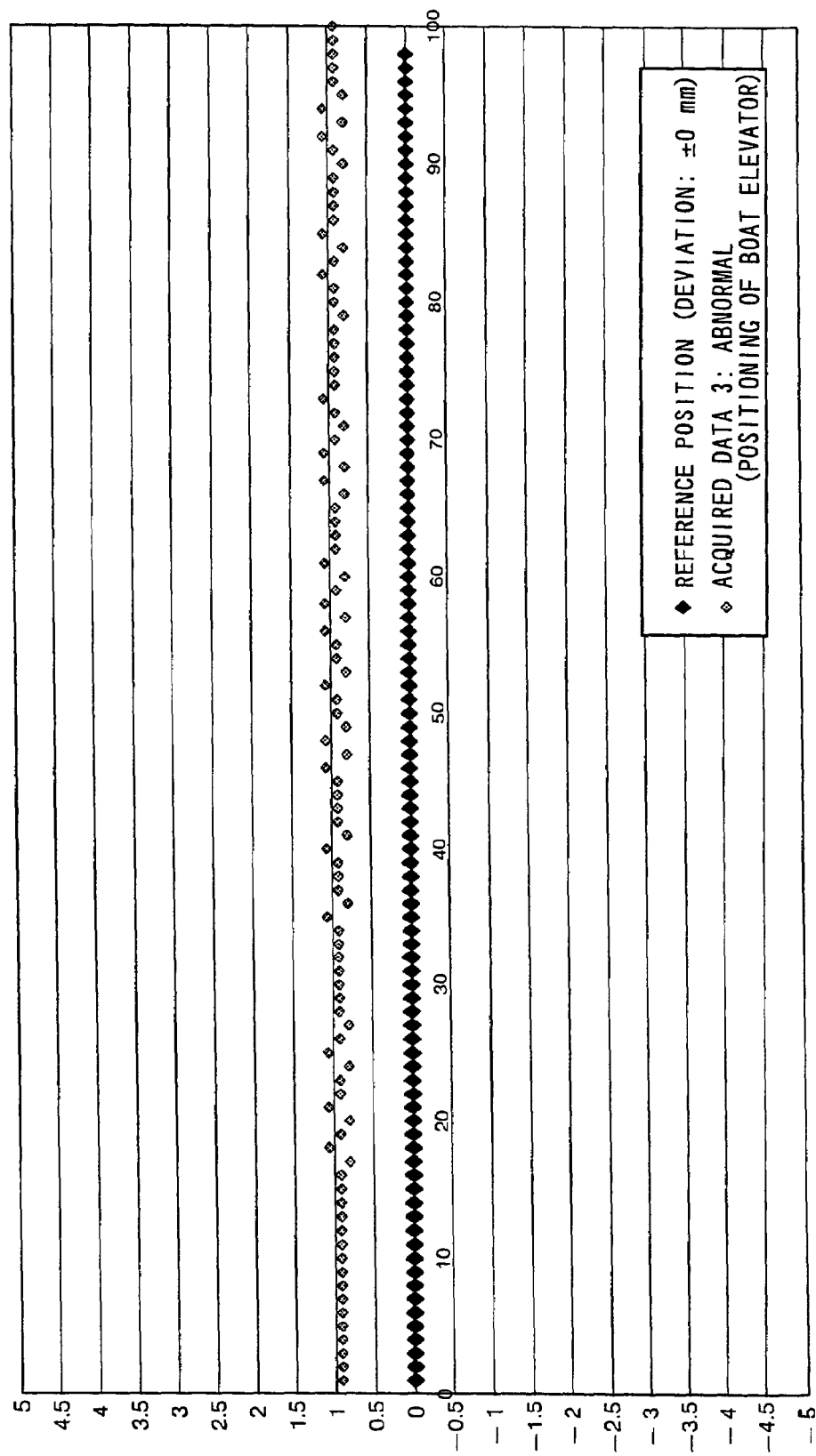
FIG. 6 is a graph of a case that acquired data of detected wafer positions are abnormal but positioning of a boat elevator is necessary in the wafer state detecting mechanism according to the invention.

FIG. 6 is a graph of a case that acquired data of detected wafer positions are abnormal but positioning of the boat elevator is necessary in the wafer state detecting mechanism according to the invention. That is, as shown in FIG. 6, the differences ΔPn between reference position data and detection position data of all the slots are larger than the allowable error limit Δt (±0.5 mm). However, since all the differences ΔPn are such that the deviations from the reference positions (±0 mm) have a small variation and are equal to about +1 mm, this case is judged an error of the stop position of the boat elevator. In this case, positioning readjustment of the boat elevator is necessary. Although all the slots are involved in the above example, deviations from the reference positions of only part of the slots, for example, only slots corresponding to a prescribed proportion (e.g., 95%) or more or a prescribed number (e.g., 95) or more of wafers, may be subjected to a check. However, in this case, it is necessary to set the prescribed proportion or the prescribed number.

Figure 7:
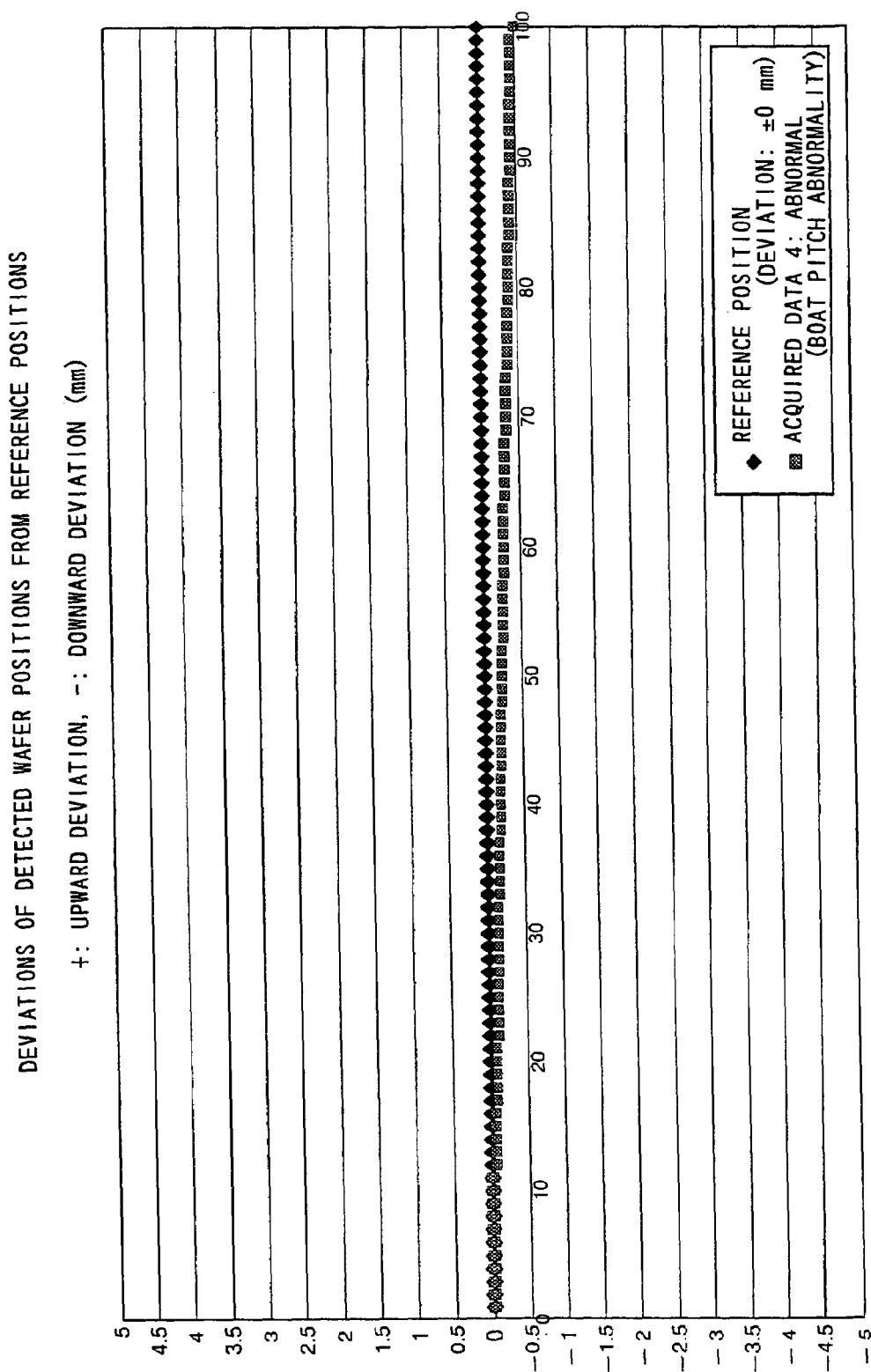
FIG. 7 is a graph of a case that acquired data of detected wafer positions correspond to a boat pitch abnormality in the wafer state detecting mechanism according to the invention.

FIG. 7 is a graph of a case that acquired data of detected wafer positions correspond to a boat pitch abnormality in the wafer state detecting mechanism according to the invention. That is, as shown in FIG. 7, the deviation of the detection position data from the reference position (±0 mm) increases monotonously and exceeds the allowable error limit Δt (±0.5 mm) at a certain slot. Since these detection position data are considered due to thermal deformation of the boat, it is necessary to announce a boat maintenance time in advance. The thermal deformation of a boat is a phenomenon that occurs in such a manner that the poles of the boat creep (i.e., are softened) when subjected to heat treatment and, as batch processes are executed repeatedly, the poles are deformed gradually and the wafer support grooves are changed in shape.

Figure 8:
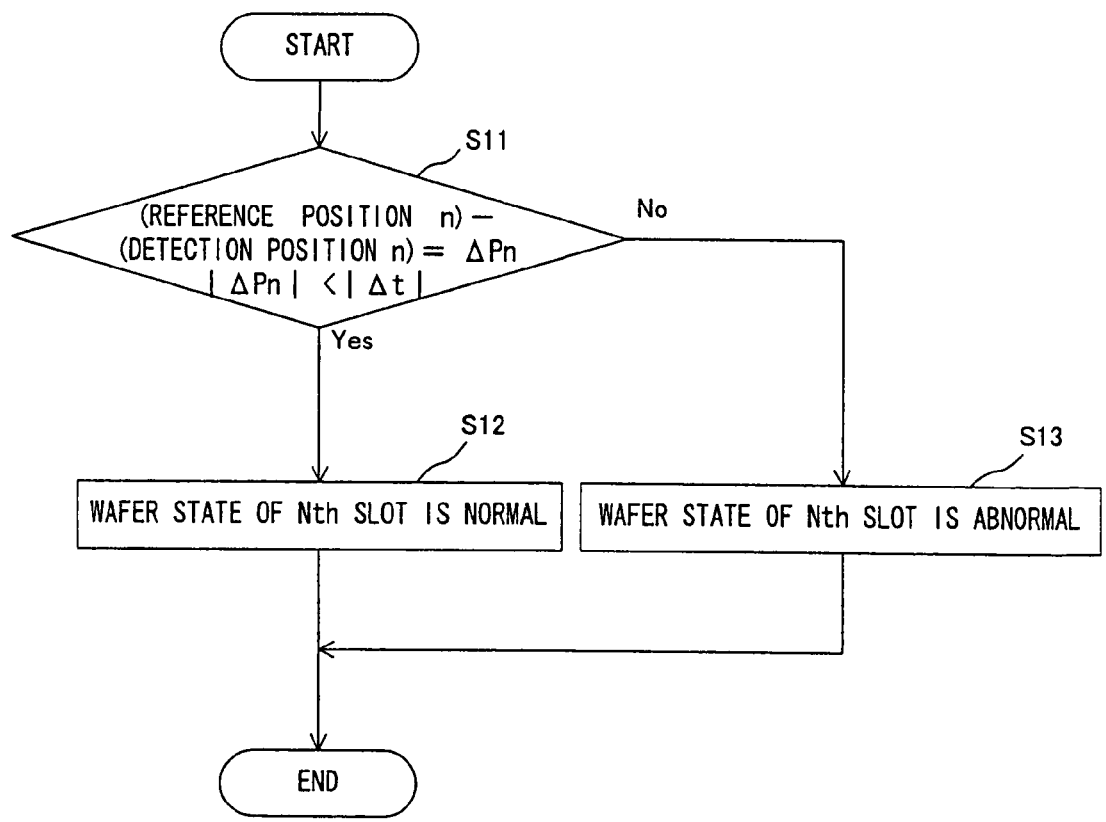
FIG. 8 is a first flowchart for comparing the difference ΔPn between reference position data and detection position data with an allowable error limit Δt in the wafer state detecting mechanism according to the invention.

Next, the four graph characteristics of FIGS. 4-7 will be judged by using flowcharts. FIG. 8 is a first flowchart for comparing the difference ΔPn between reference position data and detection position data with the allowable error limit Δt in the wafer state detecting mechanism according to the invention. First, the difference ΔPn between reference position data and detection position data of an nth slot is determined, and it is judged whether or not the absolute value of the difference ΔPn and that of the allowable error limit Δt satisfy a relationship |ΔPn|<|Δt| (step S11). If |ΔPn|<|Δt| (step S11: yes), it is judged that the wafer in the nth slot is normal (step S12). The graph of FIG. 4 corresponds to this case.

On the other hand, if it is judged at step S11 that the relationship |ΔPn|<|Δt| is not satisfied (step S11: no), it is judged that the wafer state of the nth slot is abnormal (step S13). That is, in the graph of FIG. 5, the wafer placement states of slots whose differences ΔPn are smaller than the allowable error limit Δt (±0.5 mm) are judged normal and the wafer placement states of slots whose differences ΔPn are larger than the allowable error limit Δt (±0.5 mm) are judged abnormal.

Figure 9:
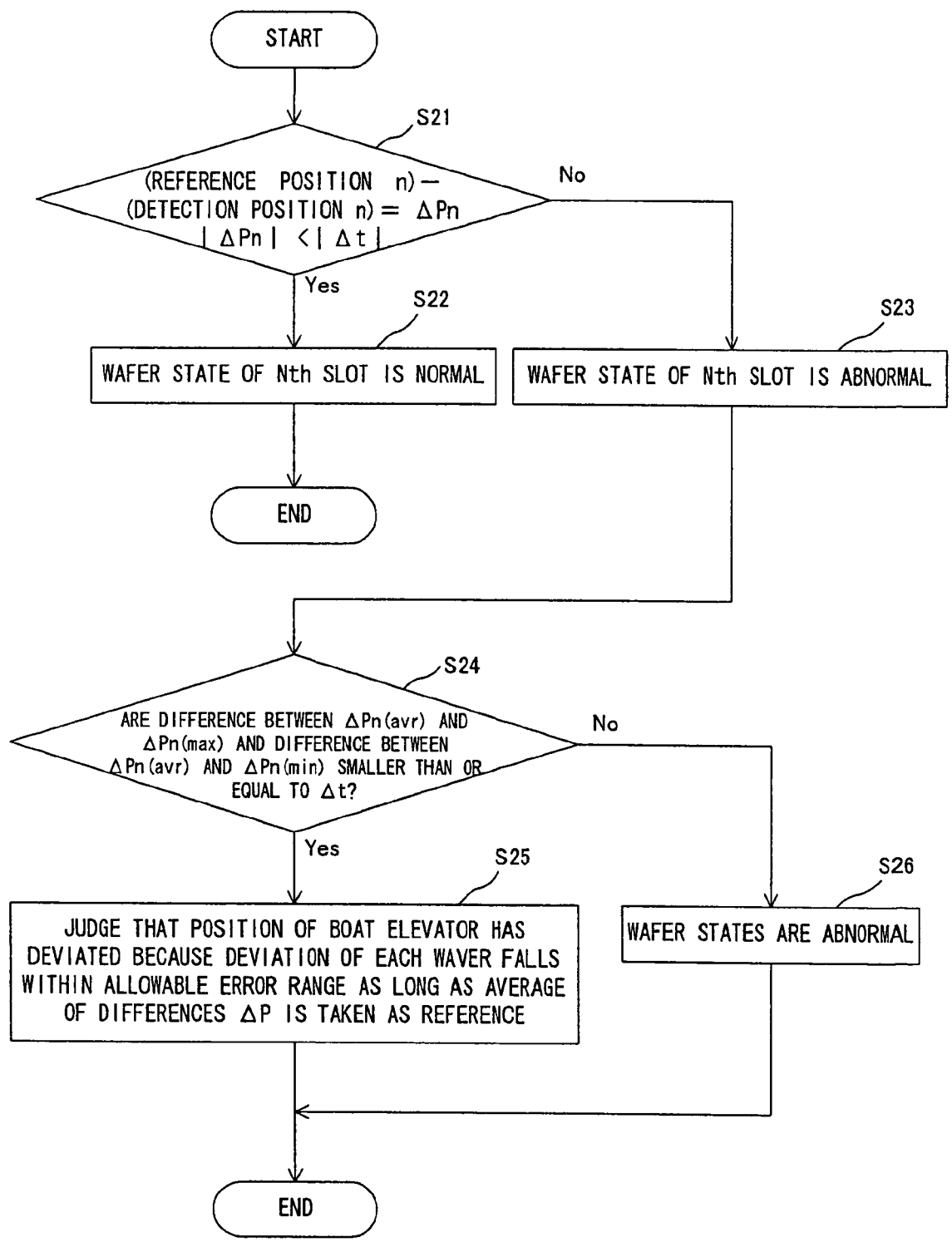
FIG. 9 is a second flowchart for comparing the difference ΔPn between reference position data and detection position data with the allowable error limit Δt in the wafer state detecting mechanism according to the invention.

FIG. 9 is a second flowchart for comparing the difference ΔPn between reference position data and detection position data with the allowable error limit Δt in the wafer state detecting mechanism according to the invention. First, the difference ΔPn between reference position data and detection position data of an nth slot is determined, and it is judged whether or not the absolute value of the difference ΔPn and that of the allowable error limit Δt satisfy a relationship |ΔPn|<|Δt| (step S21). If |ΔPn|<|Δt| (step S21: yes), it is judged that the wafer state in the nth slot is normal (step S22).

On the other hand, if it is judged at step S21 that the relationship |ΔPn|<|Δt| is not satisfied (step S21: no), it is judged that the wafer state of the nth slot is abnormal (step S23). Furthermore, it is judged whether or not the difference ΔPn(max) between an average of differences ΔPn of all the slots and a maximum value of the differences ΔPn and the difference ΔPn(min) between the average of the differences ΔPn of all the slots and a minimum value of the differences ΔPn are smaller than or equal to the allowable error limit Δt (step S24).

If ΔPn(max) and ΔPn(min) are smaller than or equal to the allowable error limit Δt (step S24: yes), it is judged that deviation has occurred in the position of the boat elevator because the deviation of each wafer falls within the range defined by the allowable error limit Δt as long as the average of the differences ΔPn is taken as a reference (step S25). On the other hand, if ΔPn(max) or ΔPn(min) is not smaller than or equal to the allowable error limit Δt (step S24: no), the wafer states are judged abnormal (step S26).

That is, if the deviation of each wafer falls within the range defined by the allowable error limit Δt for the average of the differences ΔPn (step S25), it is judged that deviation has occurred in the position of the boat elevator as in the case of the graph of FIG. 6. In other words, as in the case of the graph of FIG. 6 in which the acquired detection position data are within the range of ±0.5 mm in variation but are shifted almost uniformly from the origin position (±0 mm) by about +1 mm, the cause of the wafer abnormality is judged to be an abnormality in the stop position of the boat elevator. Although the case of FIG. 6 is an upward shift, the wafer state detecting mechanism of the invention can detect both of an upward shift and a downward shift.

A more detailed description will be made of the abnormality in the stop position of the boat elevator. The wafers-mounted boat that was input to the heat treatment furnace is lowered by the boat elevator after completion of heat treatment. Since the temperature of the boat is usually as high as about hundreds of degrees centigrade, the boat elevator which is in close proximity to the boat is exposed to high temperature while the boat is lowered. As a result, a positioning sensor of the boat elevator may fail, the accuracy in the vertical direction may be lowered due to thermal expansion of slide guides etc. of the boat elevator, or a stop position abnormality may occur due to expansion and contraction of the slide guides.

As described above, in the wafer state detecting mechanism according to the invention, reference position information to be used for judgment of individual detected wafer positions is stored in the computing unit 4. This makes it possible to correctly detect placement states (i.e., deviations) of the wafers 3 in the boat 13 at all times.

FIG. 10 is a conceptual diagram which compares wafer detection/judgment methods of a conventional wafer state detecting mechanism and the wafer state detecting mechanism according to the invention, in which FIG. 10(*a*) shows a wafer state detecting mechanism, FIG. 10(*b*) shows conventional detected states, and FIG. 10(*c*) shows detected states of the invention. As shown in FIG. 10(*a*), n wafers 3 are placed in a boat 13 with a wafer pitch 10 mm and the position of each wafer 3 is detected by using the optical axis 2 of an optical sensor 1. The allowable error limit Δt is set at ±0.5 mm (i.e., a wafer position is judged normal if the wafer pitch falls within a range of 9.5 to 10.5 mm).

According to the conventional technique of FIG. 10(*b*), all the wafer positions are judged normal because every wafer interval is 9.8 mm. A judgment result "normal" is produced though the position of the highest wafer is deviated by 3.2 mm if the origin is employed as a reference position. This may results in an event that the inserted tweezers 15 rub the back surface of the wafer 3 to cause back scratches in the wafer 3.

In contrast, according to the invention (FIG. 10(*c*)), if the allowable error limit Δt from the reference position for each wafer position is ±0.25 mm, the positions of the lowest wafer and the second lowest wafer are judged normal because their deviations (absolute values) are smaller than or equal to −0.2 mm. However, all of the wafers that are higher than the second lowest wafer are judged abnormal because their deviations (absolute values) from the reference positions are larger than −0.25 mm. Therefore, there is no probability that inserted tweezers 15 rub the back surface of a wafer 3 placed at any stage. Adjoining wafers 3 that are as close to each other as possible should have a wafer pitch 9.5 mm, and adjoining wafers that are as distant from each other as possible should have a wafer pitch 10.5 mm. Therefore, the wafer pitch range is 9.5 to 10.5 mm.

Figure 11C:
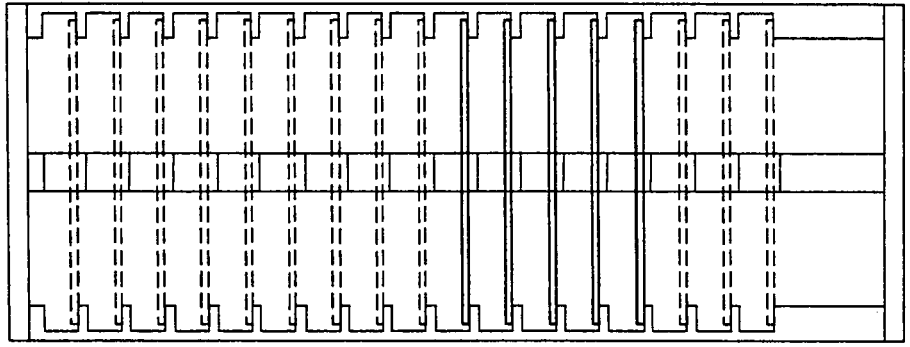
FIG. 11 shows sets of wafer placement states in a boat in a commonly used semiconductor manufacturing apparatus.
Figure 11B:
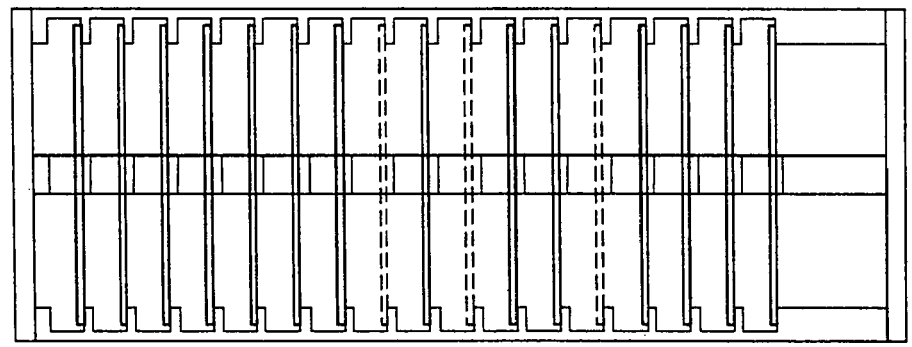
Figure 11A:
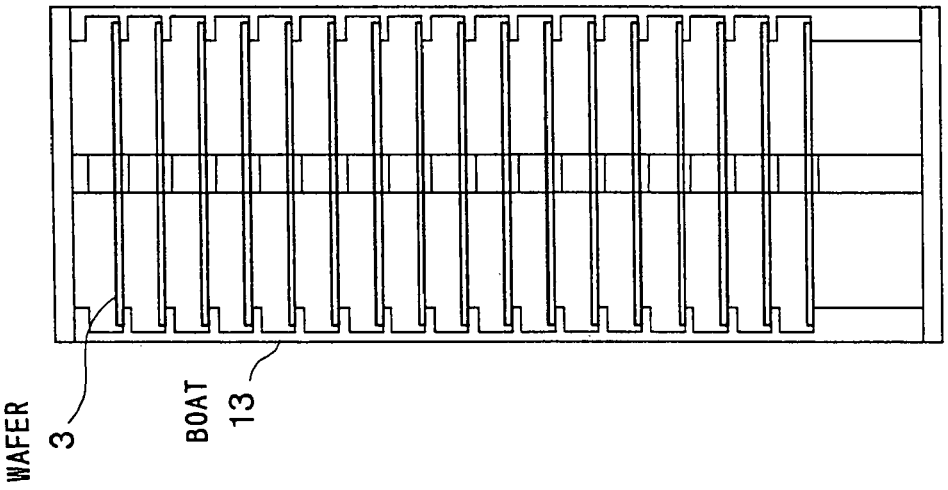

Now, a description will be made of variations of the wafer placement state. FIG. 11 shows sets of wafer placement states in a boat in a commonly used semiconductor manufacturing apparatus. FIG. 11(*a*) shows placement states in which wafers are placed in all slots which are arranged with equal pitches. Usually, wafers are placed with equal pitches in this manner. FIG. 11(*b*) shows placement states in which there exist slots in which do not have an adjacent wafer. In this manner, placement states may occur in which no wafer is placed in some slots and hence the wafer pitch is not constant in the entire boat.

FIG. 11(*c*) shows placement states in which no wafers are placed in some regions. In this manner, placement states may occur in which no wafers are placed in some boat slot regions. That is, the wafer state detecting mechanism according to the invention can detect wafer position information correctly whatever placement states (any set of states shown in FIGS. 11(*a*)-11(*c*)) wafers are rendered in.

FIG. 12 is a conceptual diagram showing how a main controller controls wafer placement using a wafer map in the wafer state detecting mechanism according to the invention. As shown in FIG. 12(*a*), a main controller 21 of a wafer processing apparatus 20 receives normality/abnormality signals relating to wafer placement information which are output from the wafer state detecting mechanism and compares those with wafer placement information (i.e., a wafer map) that is held by the main controller 21 in advance. Although each slot in which no wafer is placed satisfies an error condition of wafer absence, the main controller 21 performs resetting so that no error will occur for each slot that is not placement-designated in the wafer map. As a result, as for the state acquisition data of the wafer state detecting mechanism, as shown in FIG. 12(*b*), no error is output (skipped) for the slots in which no wafer is detected. Wafers are placed in only slots where a wafer is detected.

The invention can also realize a method for acquiring, in the wafer state detecting mechanism, comparison data to be used for judging whether wafer states are normal or abnormal. Comparison data can be acquired by providing an origin detecting sensor (e.g., composed of the flag 17 which is fixed to the transfer machine 14 and the proximity switch 18 which is fixed for vertical movement of the flag 17).

Comparison between reference position data which are acquired in the above-described manner and wafer position data which are acquired by the wafer state detecting mechanism during an ordinary operation of the substrate processing apparatus makes it possible to judge whether or not the differences ΔP between the reference position data and the wafer detection position data are within the allowable error limit Δt for successful transport by the wafer transfer machine or whether deviations are directed upward or downward.

If the differences ΔP between reference position data (described above) and actually detected wafer detection position data are larger than the allowable error limit Δt and all the wafers are placed in abnormal manners, whether or not an abnormality has occurred in the stop position of the boat elevator is judged by, for example, making a dispersion chart that represents values and directions of deviations ΔP of peaks. In an exemplary wafer state judging method by calculation, if the differences of a maximum difference ΔPmax and a minimum difference ΔPmin from an average of deviations ΔP of all wafers are within the allowable error limit Δt, it can be judged automatically that wafer pitches are normal and an abnormality has occurred in the boat stop position.

When a judgment result "abnormal" is produced above, if the wafer deviations ΔP are directed upward or downward and the deviation value increases gradually, it can be judged that a boat pitch abnormality has occurred due to thermal deformation in the heat treatment furnace and aging variations.

The embodiment has been described above in which when plural substrates have been subjected to heat treatment in the processing furnace and the boat has been output from the processing furnace, the relative position, with respect to each wafer 3, of the optical sensor 1 provided on the transfer machine 14 is varied as the transfer machine 14 is elevated or lowered. However, the invention is not limited to this embodiment. The optical sensor 1 may be fixed to the case 11, for example, at such a position as to be able to detect wafers 3 that are laid one over another in the boat 13. Each wafer 3 can be detected by varying the relative position, with respect to the wafer 3, of the optical sensor 1 as the boat 13 is lowered at the time of transport of the boat 13 out of the processing furnace. However, in this case, the flag 17 which is part of the origin position detecting sensor for detection of wafer positions is provided on the boat elevator (not shown) and the proximity switch is attached at such a position as to be switched on or off by the flag 17 (e.g., attached to the case 11).

As described above, in the semiconductor manufacturing apparatus according to the invention, wafer states can be detected by the detection sensor for detecting wafer positions or placement states and a boat state can be judged uniquely by analyzing wafer position data that are acquired by the detection. In addition, wafer position data can be acquired by a single detecting manipulation, which makes it possible to reduce the manufacturing cost and increase the throughput.

Figure 13:
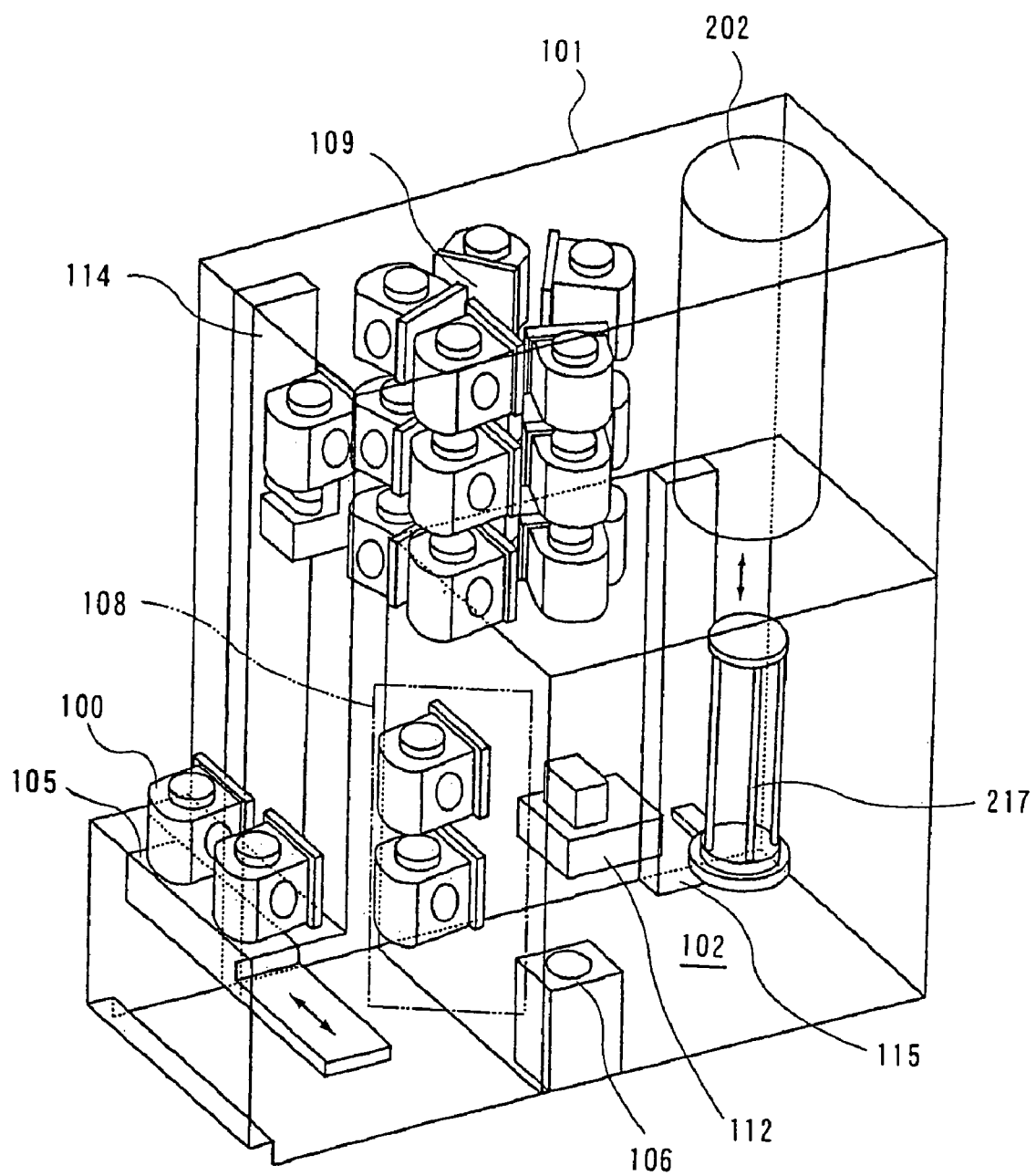
FIG. 13 is a perspective view showing an appearance of a processing apparatus according to the invention.
Figure 14:
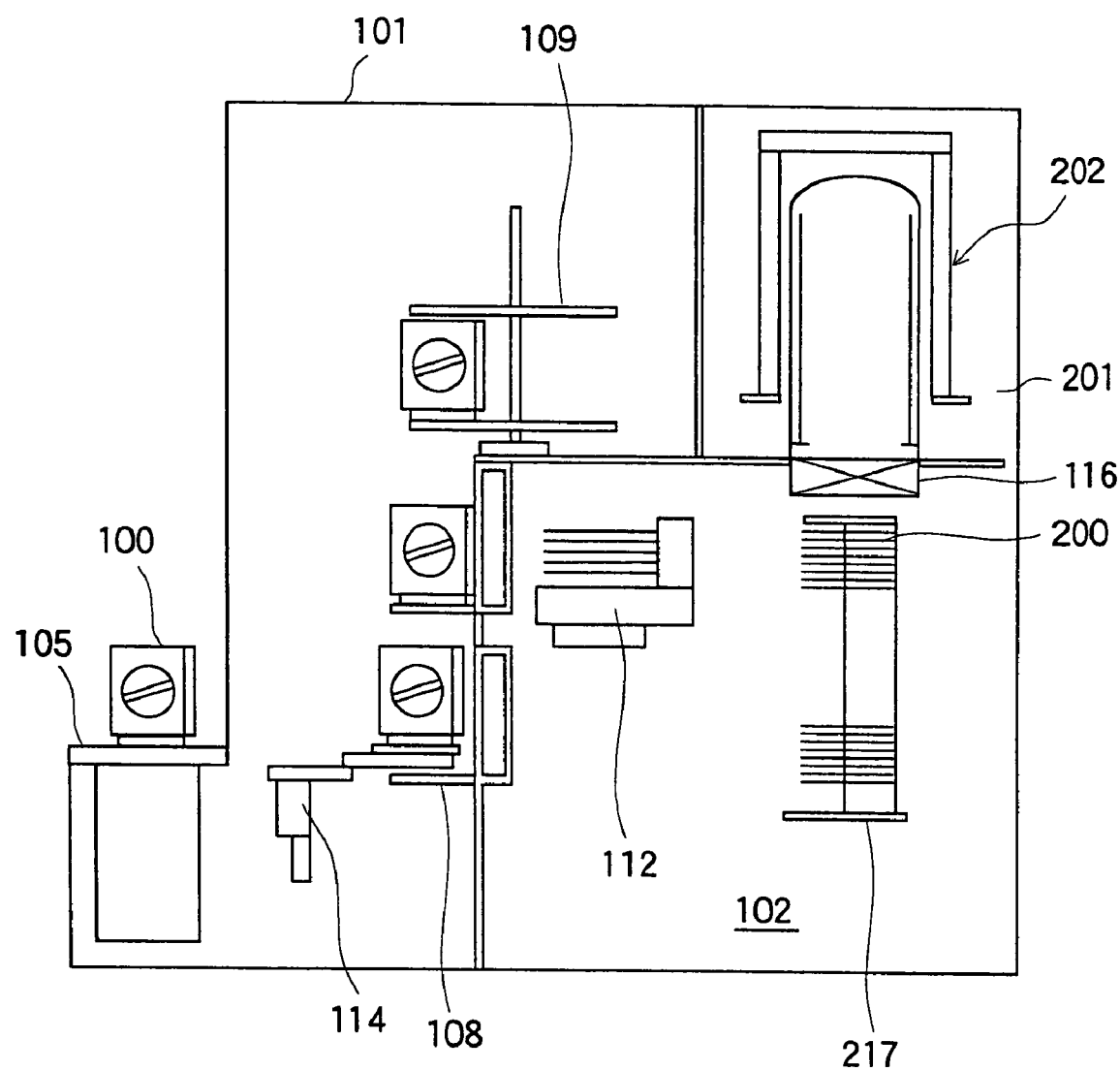
FIG. 14 is a side view of the processing apparatus of FIG. 13.

Next, a substrate processing apparatus as a specific embodiment of the semiconductor manufacturing apparatus according to the invention will be described in detail with reference to the drawings. The substrate processing apparatus which will be described below is a vertical apparatus (hereinafter referred to simply as "processing apparatus") for performing diffusion processing, CVD processing, or the like on substrates. FIG. 13 is a perspective view showing an appearance of the processing apparatus according to the invention. FIG. 13 is a see-through view. FIG. 14 is a side view of the processing apparatus of FIG. 13. Therefore, the substrate processing apparatus according to the invention will be described with reference to FIGS. 13 and 14.

In the processing apparatus according to the invention, an I/O stage (holding tool exchanging member) 105 for inserting a pod (substrate container) 100 that contains wafers (substrates) 200 made of silicon, for example, into a case 101 from the outside and, conversely, outputting the pod 100 from the case 101 is provided on the front side of the body 101. And cassette shelves (placement means) 109 for stocking pods 100 that have been inserted in the case 101 are provided in the case 101. An $N_2$ purge room (airtight room) 102 which is a transport area of wafers 200 and serves as a loading/unloading space for a boat (substrate holding means; described later) 217 is provided. The $N_2$ purge room 102 is made an airtight container so that when wafers 200 are to be subjected to some processing the inside of the $N_2$ purge room 102 is filled with an inert gas such as an $N_2$ gas to prevent formation of natural oxide films on the wafers 200.

The current mainstream of the above-mentioned pod 100 is a type called "FOUP," which makes it possible to transport the wafers 200 in such a manner that they are isolated from the air by closing, with a lid (not shown), an opening that is formed in one side wall of the pod 100 as well as to input or output the wafers 200 to or from the pod 100 by removing the lid. To remove the lid from the pod 100 and let the atmosphere in the pod 100 communicate with that in the $N_2$ purge room 102, a pod opener (opening/closing means) 108 is provided on the front side of the $N_2$ purge room 102. The transport of the pod 100 between the pod opener 108, the cassette shelves 109, and the I/O stage 105 is performed by a cassette transfer machine 114. Air that is cleaned by a cleaning unit (not shown) provided in the case 101 flows in the space in which the pod 100 is transported by the cassette transfer machine 114.

A boat 217 to be loaded with plural wafers 200 in multiple stages, a substrate positioning device 106 for positioning notches (or orientation flats) of wafers 200 at an arbitrary position, and a wafer transfer machine (transport means) 112 for transporting wafers 200 between a pod 100 on the pod opener 108, the substrate positioning device 106, and the boat 217 are provided inside the $N_2$ purge room 102. A processing furnace 202 for processing wafers 200 occupies a top portion of the $N_2$ purge room 102. The boat 217 can be loaded and unloaded into and from the processing furnace 202 by a boat elevator (elevating/lowering means) 115.

Next, the operation of the processing apparatus of FIGS. 13 and 14 will be described. First, a pod 100 that has been transported from outside the body 101 by an AGV, OHT, or the like is placed on the I/O stage 105. The pod 100 on the I/O stage 105 is transported directly onto the pod opener 108 by the cassette transfer machine 114 or is transported onto the pod opener 108 by the cassette transfer machine 114 after stocked on the cassette shelves 109. The lid of the pod 100 that has been transported onto the pod opener 108 is removed by the pod opener 108 and the atmosphere in the pod 100 is caused to communicate with that in the $N_2$ purge room 102.

Then, a wafer 200 is taken out of the pod 100 the atmosphere in which now communicates with that in the $N_2$ purge room 102, by the wafer transfer machine 112. The wafer 200 thus taken out is positioned by the substrate positioning device 106 so that the notch is located at an arbitrary position, and is then transported to the boat 217.

When the transport of wafers 200 to the boat 217 has completed, a furnace entrance shutter 116 of a processing room 201 is opened and the boat 217 that is mounted with the wafers 200 is loaded by the boat elevator 115. After the loading, the wafers 200 are subjected to arbitrary processing in the processing furnace 202. After the processing, the wafers 200 and the pod 100 are output from the case 101 by a procedure that is reverse to the above.

Figure 15:
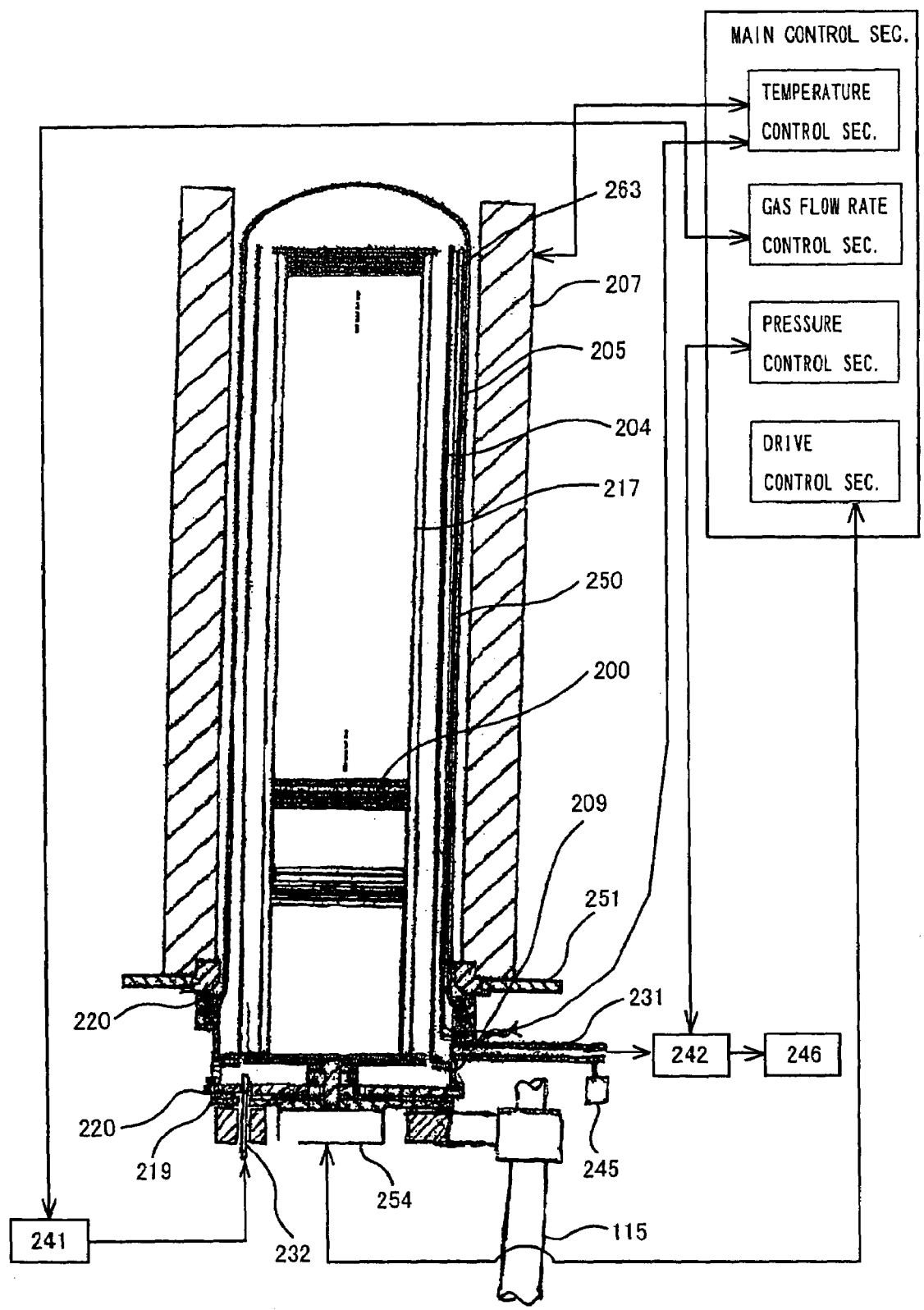
FIG. 15 is a sectional view of a low-pressure CVD furnace of the semiconductor manufacturing apparatus according to the invention.

A low-pressure CVD processing furnace shown in FIG. 15 will be described below.

In this processing furnace, the above-described control section performs semiconductor manufacture by performing CVD processing in a state that reference positions of plural substrates in a boat and an allowable range of positional deviations of the plural substrates from their reference positions are registered in advance. Then, measured substrate positions are compared with the registered values. If the positional deviations of the plural substrates are not out of the allowable range, the CVD-processed substrates are replaced by plural substrates to be subjected to CVD processing next time. Semiconductor manufacture is performed by performing CVD processing on the next (i.e., unprocessed), plural substrates.

An outer tube 205 is made of a heat-resistant material such as quartz ($SiO_2$) and assumes a cylindrical shape having a closed top and a bottom opening. An inner tube 204 assumes a cylindrical shape having top and bottom openings and is disposed inside the outer tube 205 so as to be concentric with the latter. The space between the outer tube 205 and the inner tube 204 is a cylinder-shaped space 250. A gas that rises from the top opening of the inner tube 204 passes through the cylinder-shaped space 250 and is exhausted through an exhaust pipe 231.

A manifold 209 made of stainless steel, for example, is engaged with the bottom ends of the outer tube 205 and the inner tube 204, and the outer tube 205 and the inner tube 204 are held by the manifold 209. The manifold 209 is fixed to a holding means (hereinafter referred to as "heater base 251"). The bottom end of the outer tube 205 and the top opening portion of the manifold 209 are provided with respective annular flanges. And a sealing member (hereinafter referred to as "O-ring 220") is disposed between these flanges to seal the interface between them airtightly.

A disc-shaped lid (hereinafter referred to as "sealing cap 219") made of stainless steel, for example, is attached detachably to the bottom opening portion of the manifold 209 via an O-ring 220 so as to enable airtight sealing. Gas supply pipes 232 penetrate through the sealing cap 219. A processing gas is supplied to the inside of the outer tube 205 through the gas supply pipes 232. The gas supply pipes 232 are connected to a gas flow rate control means (hereinafter referred to as "mass flow controller (MFC) 241"). Connected to a gas flow rate control section, the MFC 241 can control the flow rate of a gas being supplied to a prescribed value.

The gas exhaust pipe 231, which are coupled to a pressure adjuster (e.g., APC (automatic pressure controller) or $N_2$ ballast controller; hereinafter referred to as "APC 242") and an exhausting apparatus (hereinafter referred to as "vacuum pump 246), is connected to a top portion of the manifold 209. A pressure detecting means (hereinafter referred to as "pressure sensor 245") performs detection and a pressure control section performs a control so that a low-pressure atmosphere having a prescribed pressure is obtained by exhausting the gas flowing the cylinder-shaped space 250 between the outer tube 205 and the inner tube 204 and controlling the pressure of the inside of the outer tube 205 with the APC 242.

A rotating means (hereinafter referred to as "rotary shaft 254") is connected to the sealing cap 219. The rotary shaft 254 rotates a substrate holding means (hereinafter referred to as "boat 217") and substrates (hereinafter referred to as "wafers 200") held in the boat 217. Connected to an elevating/lowering means (hereinafter referred to as "boat elevator 115"), the sealing cap 219 elevates and lowers the boat 217. A drive control section performs controls so that the rotary shaft 254 and the boat elevator 115 operate at prescribed speeds.

A heating means (hereinafter referred to as "heater 207") surrounds the outer tube 205 so as to be concentric with the latter. A temperature control means (hereinafter referred to as "thermocouple 263") detects the temperature and a temperature control section performs a control so that the temperature of the inside of the outer tube 205 is set at a prescribed processing temperature by means of the heater 207.

An exemplary low-pressure CVD processing method of the processing furnace shown in FIG. 15 will be described below. First, the boat 217 is lowered by the boat elevator 115. The boat 217 is caused to hold plural wafers 200. Then, the temperature of the inside of the outer tube 205 is set to a prescribed processing temperature while heating is performed by the heater 207. The inside of the outer tube 205 is filled with an inert gas in advance by the MFC 241 which is connected to the gas supply pipes 232. The boat 217 is elevated into the outer tube 205 by the boat elevator 115, and the inside temperature of the outer tube 205 is kept at the prescribed processing temperature. After the inside of the outer tube 205 is exhausted to establish a prescribed vacuum state, the boat 217 and the wafers 200 held in the boat 217 are rotated by the rotary shaft 254. At the same time, a processing gas is supplied through the gas supply pipes 232. The gas thus supplied goes up in the outer tube 205 and is supplied to the wafers 200 uniformly.

While low-pressure CVD processing is being performed, the inside of the outer tube 205 is exhausted through the exhaust pipe 231 and the inside pressure of the outer tube 205 is controlled to a prescribed vacuum state by the APC 242. The low-pressure CVD processing is thus performed for a prescribed time.

When the low-pressure CVD processing has completed, a transition is made to low-pressure CVD processing for the next wafers 200. That is, the gas in the outer tube 205 is replaced by an inert gas and the inside pressure is increased to normal pressure. Then, the boat 217 is lowered by the boat elevator 115 and the boat 217 and the processed wafers 200 are taken out of the outer tube 205. At this time, measurement values of the positions of the plural processed wafers 200 in the boat 217 are compared with their reference positions and the allowable range of positional deviations from the reference positions of the plural substrates which are registered in the control section in advance. If the deviations of the plural processed wafers 200 are in normal states, that is, they fall within the positional deviation allowable range, the processed wafers 200 in the boat 217 which has been taken out of the outer tube 205 are replaced by plural unprocessed wafers 200 to be subjected to CVD processing next time. The boat 217 is elevated into the outer tube 205 and subjected to low-pressure CVD processing in the same manner as described above.

Exemplary conditions of processing (for formation of an $Si_3N_4$ film) that is performed in the processing furnace according to the embodiment are as follows: the wafer temperature is 770° C., the gas supply rates of dichrolosilane ($SiH_2Cl_2$) and ammonia ($NH_3$) are 180 sccm and 1,800 sccm, respectively, and the pressing pressure is 55 Pa.

The invention claimed is:

1. A semiconductor manufacturing apparatus comprising:
   a processing furnace for performing prescribed heat treatment on plural substrates;
   a boat for carrying the plural substrates that are laid one over another in the boat into and out of the processing furnace;
   a substrate detecting sensor for detecting the plural substrates laid one over another in the boat by changing a relative position of the substrate detecting sensor with respect to each of the plural substrates; and
   a control section for registering reference positions of the plural substrates and an allowable range of positional deviations from the reference positions of the plural substrates,
   wherein the control section receives pieces of position information of the plural substrates measured by the substrate detecting sensor, compares a maximum value of pieces of position information of substrates with an average thereof and compares a minimum value of pieces of position information of substrates with an average thereof if a piece or pieces of position information of substrates are out of the allowable range of positional deviations from the reference positions of the plural substrates, and judges that deviation has occurred in a boat stop position if differences determined by the respective comparisons are within the allowable range of deviations of the substrates.

2. The semiconductor manufacturing apparatus according to claim 1, wherein the control section outputs a failure signal indicating occurrence of deviation in the boat stop position if the differences determined by the respective comparisons are within the allowable range of deviations of the substrates.

3. The semiconductor manufacturing apparatus according to claim 2, wherein the control section compares a maximum value of pieces of position information of a preset, prescribed proportion, in number, of all of the plural substrates with an average thereof and compares a minimum value of pieces of position information of a preset, prescribed proportion, in number, of all of the plural substrates with an average thereof.

4. The semiconductor manufacturing apparatus according to claim 2, wherein the control section compares a maximum value of pieces of position information of a preset, prescribed number of substrates with an average thereof and compares a minimum value of pieces of position information of a preset, prescribed number of substrates with an average thereof.

5. The semiconductor manufacturing apparatus according to claim 2, wherein the control section compares a maximum value of the pieces of position information of all of the plural substrates with an average thereof and compares a minimum value of the pieces of position information of all of the plural substrates with an average thereof.

6. A semiconductor manufacturing apparatus comprising:
   a processing furnace for performing prescribed heat treatment on plural substrates;
   a boat for carrying the plural substrates that are laid one over another in the boat into and out of the processing furnace;
   a substrate detecting sensor for detecting the plural substrates laid one over another in the boat by changing a relative position of the substrate detecting sensor with respect to each of the plural substrates; and a control section for registering reference positions of the plural substrates and an allowable range of positional deviations from the reference positions of the plural substrates, wherein the control section receives pieces of position information of the plural substrates measured by the substrate detecting sensor, checks whether substrate positions vary gradually if the pieces of position information of the plural substrates are out of the positional deviation allowable range, and judges that boat deformation has occurred if a gradual variation of the substrate positions is detected.

7. The semiconductor manufacturing apparatus according to claim 6, wherein the control section outputs a failure signal indicating occurrence of boat deformation if detecting a gradual variation of substrate positions by checking whether the substrate positions vary gradually.

8. A semiconductor manufacturing apparatus comprising:

a processing furnace for performing prescribed heat treatment on plural substrates;

a boat for carrying the plural substrates that are laid one over another in the boat into and out of the processing furnace;

a substrate detecting sensor for detecting the plural substrates laid one over another in the boat by changing a relative position of the substrate detecting sensor with respect to each of the plural substrates; and a control section for measuring positions of the plural substrates with the substrate detecting sensor after or during transport of the boat out of the processing furnace when the plural substrates have been subjected to the heat treatment in the processing furnace, comparing measurement values with plural registered reference positions, and judging that an abnormality has occurred in the substrate positions if results of comparison are out of an allowable range of deviations of the plural substrates.

9. The semiconductor manufacturing apparatus according to claim 8, wherein the control section outputs a failure signal if judging that an abnormality has occurred in the substrate positions.

* * * * *